United States Patent
Schuele et al.

(10) Patent No.: US 10,804,426 B2
(45) Date of Patent: Oct. 13, 2020

(54) PLANAR SURFACE MOUNT MICRO-LED FOR FLUIDIC ASSEMBLY

(71) Applicant: eLUX Inc., Vancouver, WA (US)

(72) Inventors: Paul J. Schuele, Washougal, WA (US); Changqing Zhan, Vancouver, WA (US); Kenji Sasaki, West Linn, OR (US); Kurt Ulmer, Vancouver, WA (US); Jong-Jan Lee, Camas, WA (US)

(73) Assignee: ehux, Inc., Vancouver, WA (US)

( * ) Notice: Subject to any disclaimer, the term of this patent is extended or adjusted under 35 U.S.C. 154(b) by 0 days.

(21) Appl. No.: 16/406,080

(22) Filed: May 8, 2019

(65) Prior Publication Data

US 2019/0319163 A1    Oct. 17, 2019

Related U.S. Application Data

(63) Continuation-in-part of application No. 16/125,671, filed on Sep. 8, 2018, now Pat. No. 10,516,084, which
(Continued)

(51) Int. Cl.
| | | |
|---|---|---|
| *H01L 33/00* | (2010.01) | |
| *H01L 33/38* | (2010.01) | |
| *H01L 33/24* | (2010.01) | |

(52) U.S. Cl.
CPC ...... *H01L 33/0093* (2020.05); *H01L 33/0095* (2013.01); *H01L 33/24* (2013.01); *H01L 33/38* (2013.01)

(58) Field of Classification Search
CPC ..... H01L 25/50; H01L 27/153; H01L 33/007; H01L 2224/75655; H01L 2224/76733; H01L 2224/95144
See application file for complete search history.

(56) References Cited

U.S. PATENT DOCUMENTS

| | | | |
|---|---|---|---|
| 2005/0247949 A1* | 11/2005 | Senda | H01L 33/145 257/98 |
| 2007/0187702 A1* | 8/2007 | Lee | H01L 33/20 257/94 |

(Continued)

OTHER PUBLICATIONS

Zhang et al., "The InGaN Material System and Blue/Green Emitters," in Li, Jinmin, Zhang, G. Q. (Eds.), Light-Emitting Diodes, Solid State Lighting Technology (series 4), 2019.
(Continued)

*Primary Examiner* — Sitaramarao S Yechuri
(74) *Attorney, Agent, or Firm* — Law Office of Gerald Maliszewski; Gerald Maliszewski

(57) ABSTRACT

Planar surface mount (SM) micro light emitting diodes (µLEDs) are presented. The fabrication method provides a MOCVD LED structure with a stack including a first doped semiconductor in a first plane, a MQW layer overlying the first doped semiconductor in a second plane, and a second doped semiconductor overlying the MQW layer in a third plane. An electrical insulator is conformally deposited over the etched stack in a fourth plane, and etched to expose the second doped semiconductor, creating a first via. Etching exposes the first doped semiconductor, creating a second via. A first electrode is connected to the second doped semiconductor through the first via, and has a substrate interface surface in a fifth plane with an average planarity tolerance of less than 10 nanometers. A second electrode is connected to the first doped semiconductor through the second via, and has a substrate interface surface in the fifth plane.

34 Claims, 17 Drawing Sheets

Related U.S. Application Data is a continuation-in-part of application No. 15/838,536, filed on Dec. 12, 2017, now Pat. No. 10,242,977, which is a continuation-in-part of application No. 15/722,037, filed on Oct. 2, 2017, now Pat. No. 10,543,486, which is a continuation-in-part of application No. 15/691,976, filed on Aug. 31, 2017, now Pat. No. 10,535,640, which is a continuation-in-part of application No. 15/440,735, filed on Feb. 23, 2017, now Pat. No. 10,381,335, which is a continuation-in-part of application No. 15/416,882, filed on Jan. 26, 2017, now Pat. No. 10,446,728, which is a continuation-in-part of application No. 15/413,053, filed on Jan. 23, 2017, now Pat. No. 10,520,769, which is a continuation-in-part of application No. 15/412,731, filed on Jan. 23, 2017, now Pat. No. 10,418,527, which is a continuation-in-part of application No. 15/410,195, filed on Jan. 19, 2017, now Pat. No. 10,236,279, which is a continuation-in-part of application No. 15/410,001, filed on Jan. 19, 2017, now Pat. No. 9,825,202, which is a continuation-in-part of application No. 14/749,569, filed on Jun. 24, 2015, now Pat. No. 9,722,145, and a continuation-in-part of application No. 15/221,571, filed on Jul. 27, 2016, now Pat. No. 9,755,110, and a continuation-in-part of application No. 15/197,266, filed on Jun. 29, 2016, now Pat. No. 10,249,599, and a continuation-in-part of application No. 15/190,813, filed on Jun. 23, 2016, now Pat. No. 9,892,944, and a continuation-in-part of application No. 15/158,556, filed on May 18, 2016, now Pat. No. 9,985,190, and a continuation-in-part of application No. 15/266,796, filed on Sep. 15, 2016, now Pat. No. 9,917,226, and a continuation-in-part of application No. 14/680,618, filed on Apr. 7, 2015, now Pat. No. 10,115,862, which is a continuation-in-part of application No. 14/530,230, filed on Oct. 31, 2014, now abandoned.

(56) References Cited

U.S. PATENT DOCUMENTS

| | | | | |
|---|---|---|---|---|
| 2010/0096640 | A1* | 4/2010 | Kim | H01L 31/18 |
| | | | | 257/82 |
| 2012/0138957 | A1* | 6/2012 | Shim | H01L 21/0254 |
| | | | | 257/77 |
| 2012/0223345 | A1* | 9/2012 | Tomoda | H01L 33/46 |
| | | | | 257/89 |
| 2013/0270604 | A1* | 10/2013 | Furukawa | H01L 33/38 |
| | | | | 257/99 |
| 2013/0313591 | A1* | 11/2013 | Shimada | H01L 23/3171 |
| | | | | 257/98 |
| 2017/0294566 | A1 | 10/2017 | Hsieh et al. | |
| 2018/0076369 | A1 | 3/2018 | Cheng et al. | |
| 2018/0212105 | A1 | 7/2018 | Tu et al. | |

OTHER PUBLICATIONS

Wang et al.,"The AlGaInP/AlGaAs Material System and Red/Yellow LED," in Li, Jinmin, Zhang, G. Q. (Eds.), Light-Emitting Diodes, Solid State Lighting Technology (series 4) 2019.

Ray-Hua Horng et. al., "Development and Fabrication of AlGaInP-Based Flip-Chip Micro-LEDs," IEEE J. Electron Devices Soc. vol. 6, pp. 475-479, Apr. 2018.

Liu et al., "A Novel BLU-Free Full-Color LED Projector Using LED on Silicon Micro-Displays," IEEE Photonics Technology Letters, vol. 25, pp. 2267-2270, Dec. 2013.

* cited by examiner

BUILDUP

SOLDER

BONDING

EMITTER 10%

EMITTER 57%

EMITTER 75%

PLANAR SURFACE MOUNT MICRO-LED FOR FLUIDIC ASSEMBLY

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to display technology and, more particularly, to the design of surface mount (SM) inorganic micro-light emitting diodes (μLEDs) with improved electrode interface surface planarity.

2. Description of the Related Art

A color display is composed of pixels that emit light in three wavelengths corresponding to the visible colors red, green, and blue, which is referred to as an RGB display. The RGB components of the pixel are turned on and off in a systematic way to additively produce the colors of the visible spectrum. There are several display types that produce the RGB images in different ways. Liquid crystal displays (LCD) are the most prevalent technology and they produce RGB images by shining a white light source, typically a phosphor produced white LED, through a color filter of a subpixel. Some portions of the white light wavelengths are absorbed while some are transmitted through color filters. Organic light emitting diode (OLED) displays produce RGB light by the direct emission of each of those wavelengths of light at a pixel level from within the organic light emitting material.

A third display technology is the micro-LED display. This display technology uses micro-sized (10 to 150 μm diameter) inorganic LEDs for direct emission of light at the pixel level. In order to make an RGB display using micro-LEDs it is necessary to assemble large area arrays of three different types of micro-LEDs that respectively emit in each of the RGB range of wavelengths. The low-cost manufacture of micro-LED displays requires the use of a massively parallel fluidic assembly technique to position millions of individual micro-LEDs in regular arrays. The current mainstream television with HDTV resolution has 6 million pixels and the higher resolution 4K and 8K standards have 25 and 99 million pixels respectively.

The fluidic assembly technique imposes several unique requirements on the micro-LED structure in order to produce high yield low cost displays with the appropriate brightness, some of which are discussed herein. A practical display technology must address the reality that displays are manufactured in different sizes and resolutions, so flexibility in the size of a pixel is required, from more than 300 pixel per inch (ppi) for personal devices, to 10-20 ppi for very large public information display applications. Display brightness requirements also vary by application from 300 nits (candela per square meter) for a cell phone display, 1000 nits for a television, to as much as 5000 nits for an outdoor information display. Thus, the micro-LED technology must be adaptable to meet a wide range of resolution and brightness requirements while still maintaining the physical properties necessary to enable the use of fluidic assembly.

The development of gallium nitride (GaN) based blue LEDs for general lighting and aluminum gallium indium phosphide (AlGaInP) red LEDs for a variety of indicator lights has matured over many generations and these processes can produce reliable high efficiency devices at very low cost. Therefore, perhaps the most important requirement is that the micro-LED structure must be compatible with the conventional Metal-Organic Chemical Vapor Deposition (MOCVD) fabrication of commercial inorganic LEDs. There are many possible variants in LED fabrication so this summary provides only a very brief overview to identify the factors required to make high quality LEDs, while also delineating the unique differences between conventional LEDs and the micro-LEDs described herein. Reviews of GaN LEDs for green and blue emission by Zhang and Liu (Ning Zhang and Zhiqiang Liu, "The InGaN Material System and Blue/Green Emitters," in Li, Jinmin, Zhang, G. Q. (Eds.), *Light-Emitting Diodes*, Solid State Lighting Technology and Applications Series 4 (Springer, Switzerland, 2019)), and AlGaInP based red LEDs by Wang et. al. (Guohong Wang, Xiaoyan Yi, Teng Zhan and Yang Huang, "The AlGaInP/AlGaAs Material System and Red/Yellow LED," in Li, Jinmin, Zhang, G. Q. (Eds.), *Light-Emitting Diodes*, Solid State Lighting Technology and Applications Series 4 (Springer, Switzerland, 2019)) are useful summaries of conventional LED technology for emission in the visible spectrum.

FIG. 1A through 1C are drawings depicting a GaN LED wafer used for general lighting purposes (prior art). GaN based LEDs that emit in the blue (around 440 nanometer (nm)) and green (around 530 nm) are fabricated in a complex series of high temperature MOCVD steps to produce the vertical LED structure shown in cross-section in FIG. 1A. Fabrication takes place on a polished sapphire, silicon (Si), or silicon carbide (SiC) growth substrate 50 to 200 millimeters (mm) in diameter. The surface is prepared by depositing an optional AlN buffer layer plus undoped GaN to produce a crystalline surface with low defects and the lattice constant of GaN. The thickness and temperature of this initial deposition is tuned to compensate for the lattice mis-match between the growth substrate and GaN. The surface quality improves with increasing thickness, so high efficiency devices are over about 3 microns (μm) thick. Because the MOCVD deposition process is complex and expensive, it is important that the micro-LED process is optimized to most effectively use the full area of the growth wafer (growth substrate).

After the initial growth to prepare a crystalline GaN surface, the first LED layer is grown with Si doping added to produce n+ GaN (n-GaN) for the cathode. Optionally, the stack can include layers tuned for electron injection and hole blocking. Next, a Multiple Quantum Well (MQW) structure is deposited with alternating layers of indium gallium nitride ($In_xGa_{1-x}N$) and GaN, where the indium content and the thickness of the layers determine the emission wavelength of the device. Increasing the indium content moves the emission peak to longer wavelengths, but also increases the internal stress due to lattice mismatch, so high-efficiency GaN devices cannot be made for red emission, and the efficiency of green emitting devices is less than that of blue LEDs. After the MQW, the stack can include layers tuned for electron blocking and hole injection. Finally, the MOCVD sequence is completed by depositing magnesium (Mg)-doped GaN to form the p+ anode.

The completed substrate is then patterned and etched to produce individual LEDs, and additional processing is carried out to form electrodes on the anode and cathode as shown schematically in FIG. 1B. In the simplest process flow, a transparent conductive electrode is formed by depositing a thin layer of nickel oxide ($NiO_x$) to match the p+ GaN (p-GaN) work function, followed by a layer of indium tin oxide (ITO) that may be 100 to 300 nm thick. This layer is patterned and etched to form the current spreading layer over the anode.

A small area is patterned and etched through the stack to make contact to the n+ GaN. A passivation layer, typically silicon dioxide ($SiO_2$), is deposited to prevent leakage current between the anode and cathode, and contact windows are opened over the electrodes. An electrode is deposited (typically of titanium/aluminum (Ti/Al)) to form the cathode contact and a second electrode is added (the anode), which may be Ni gold (Ni/Au), chromium Au (Cr/Au), or the like. The substrate is thinned to 100 µm by grinding and individual devices are singulated either by cleaving or sawing. Device made by this process are typically 100 µm thick and 150 to 1000 µm in size (cross-section) as shown for example in FIG. 1C.

FIGS. 2A and 2B are diagrams depicting a gallium arsenide (GaAs) LED wafer used to make red emitting indicators (prior art). High brightness red LEDs are fabricated using a significantly different MOCVD process sequence based on the GaAs material system as shown schematically in FIG. 2A. The growth substrate is an n-doped GaAs wafer several hundred microns thick and the first layer deposited is GaAs, to produce a high quality crystalline surface. The next layer is aluminum/arsenide (AlAs), which is used subsequently as a release layer. The LED stack may start with an optional n-doped Distributed Bragg Reflector (DBR) layer or an n-doped GaInP window layer and an n-doped AlGaInP cladding layer. Then, the MQW active region is deposited with alternating layers of AlGaInP and AlGaAs with the thickness and composition adjusted to make a high efficiency LED emitting at the chosen wavelength. The active region is covered with a p-doped cladding layer of AlGaInP and a p-doped GaInP window layer to complete the LED. The full LED stack above the AlAs release layer may be 10 to 15 µm thick.

The GaAs growth substrate is lattice matched for the MOCVD growth of AlGaInP, but GaAs absorbs light and is very brittle, which are serious disadvantages for LED packaging. Consequently, the LED device is removed from the substrate either by completely etching the substrate or by using a selective wet etch (typically hydrogen chloride (HCl):acetic acid) to undercut and release the device as shown in FIG. 2B. Before removing the LED from the substrate, a thick layer of copper is deposited by electroplating that serves as a heat sink and as a handling interface for each device. First, a gold strike layer is deposited and patterned to define the copper regions, and copper is electroplated to a thickness of about 100 µm. Then, the LED stack is etched around the copper islands down to the GaAs buffer layer and a subsequent release etch undercuts the device by wet etching the AlAs layer. The device size (cross-section) is similar to that of GaN general lighting LED of 150 to 1000 microns.

FIGS. 3A and 3B respectively depict partial cross-sectional views of conventional packaged blue and red LEDs (prior art). These figures are presented to distinguish between the micro-LED (presented in the Detailed Description, below) and the conventional packaging techniques used for larger LEDs. For general lighting white light is produced by a blue emitting GaN device, as shown in FIG. 1B, with an additional color conversion phosphor that covers the LED and converts some of the blue light to longer wavelengths, typically a broad yellow emission of a phosphor such as Cerium(III)-doped YAG (YAG:$Ce^{3+}$, or $Y_3Al_5O_{12}$:$Ce^{3+}$). The package used has a lead frame to make electrical connections, a heat slug to dissipate the thermal energy produced in the LED, and a reflector that directs the light toward the user. The LED is attached to the heat slug with a thermally conductive adhesive and the LED terminals are connected to the lead frame by wire bonding. After bonding, the package cavity is filled with a transparent encapsulant, typically of silicone or epoxy, that protects the device from mechanical damage and corrosion from air and water in the environment. The encapsulant may also contain a color conversion phosphor, or the phosphor may be in a separate film over the package (not shown). After the packaging is complete, the device is tested for efficiency and peak wavelength in a process referred to as binning. If the device has acceptable performance, it is bonded to a printed circuit board (PCB) along with other devices in an array. It is important to note that a lighting array contains multiple devices connected in series, parallel, or series/parallel depending on the required operating voltage and luminance. Unlike a display array (e.g., a television or smartphone display), which requires that each pixel has a controllable luminance to produce an image, all devices in a general lighting array operate in unison at the same time.

Displays built in the range of 10 to 600 ppi necessarily require micro-LEDs with a small cross-section (diameter) of less than 150 microns. As described in greater detail below, micro-LED dimensions and internal structures result from using routine photolithography processes to form a pattern controlled by mask design, film thickness, and photoresist exposure. Using the photolithographic pattern as a mask, an etching process selectively removes material to form the features of the completed device. In the case of GaN for example, etching is not perfectly uniform across the wafer, and from wafer to wafer, so there can be significant variation in the amount of buildup required to create a structure with coplanar N-pad (electrode connected to the n+ semiconductor) and P-pad (electrode connected to the p+ semiconductor) electrodes. The deposition of the buildup metal is by evaporation or sputtering, and thickness control is even less precise than for the photolithography steps. If the micro-LED N-pad and P-pad electrodes are not co-planar, then the micro-LED electrical connections to the display substrate may be incomplete, causing failure or high series resistance.

For the purpose of minimizing faults in the fabrication of display substrates using SM LEDs, it would be advantageous if the substrate interface surfaces of the LED electrodes could be maximally planar.

SUMMARY OF THE INVENTION

Described herein are micro-light emitting diode (LED) structures with a diameter between 10 and 150 µm that are suited for the fluidic assembly of large area arrays to make high-resolution red-green-blue (RGB) displays. The micro-LED fabrication process is compatible with blue/green LEDs based on gallium nitride (GaN) and red LEDs based on aluminum gallium indium phosphide (AlGaInP) produced by conventional metal-organic chemical vapor deposition (MOCVD) growth technology. The resulting micro-LED has an electrode structure that can be electrically and physically bonded to array contacts in a display substrate after fluidic assembly to make an active or passive matrix display. The disclosed micro-LED structures enable pixel brightness to be changed over a range to satisfy different display requirements without changing the structure of the micro-LED, so that yield and reliability of the fluidic assembly process is not affected.

Accordingly, a method is provided for fabricating a surface mount (SM) micro-LED (µLED). The method provides a MOCVD LED structure on a growth substrate. A stack overlies the growth substrate including a first doped semiconductor with a top surface in a first plane, a multiple quantum well (MQW) layer overlying the first doped semiconductor having a top surface in a second plane, and a second doped semiconductor overlying the MQW layer having a top surface in a third plane, where the first and second doped semiconductors are oppositely doped with n and p dopants, see FIGS. 1A and 2A. In the case of a gallium nitride micro-LED, the first and second doped semiconductors are doped GaN. In the case of a gallium arsenide (GaAs) micro-LED, first and second doped semiconductors can be either doped gallium phosphide (p-GaP) or doped gallium indium phosphide (n-GaInP).

The method etches the MOCVD stack to form a plurality of singulated dies on the growth substrate. A µLED is fabricated from each die by first selectively etching the above-mentioned stack. An electrical insulator is conformally deposited to form a top surface in a fourth plane overlying the etched stack, and then selectively etched to expose the second doped semiconductor, to create a first via. Selective etching is also performed to expose the first doped semiconductor, creating a second via. A first electrode is formed overlying the first via, connected to the second doped semiconductor through the first via, and has a substrate interface surface in a fifth plane. A second electrode is formed overlying the second via, connected to the first doped semiconductor through the second via, and has a substrate interface surface in the fifth plane. Finally, the fabricated µLEDs are separated from the growth substrate. The LEDs have a maximum cross-section co-planar with the first, second, and third planes of 150 microns, a plateau stack height orthogonal to the first, second, and third planes of less than 2 microns, a fifth plane average planarity tolerance of less than 10 nanometers, due to the use of a conventional MOCVD wafer.

More explicitly, the method is able to fabricate a SM center emission µLED by selectively etching the stack to create a central plateau stack surrounded by a trench moat exposing the first doped semiconductor, and a perimeter stack segmented by a perimeter trench valley exposing the first doped semiconductor. Then, conformally depositing the electrical insulator overlying the etched stack includes forming the fourth plane overlying the central plateau stack and the perimeter stack. The step of selectively etching to expose the second doped semiconductor includes etching a portion of the electrical insulator overlying the central plateau stack to create the first via, and the step of selectively etching to expose the first doped semiconductor includes etching the electrical insulator overlying the perimeter trench valley to create the second via. As a result, the first electrode overlies the central plateau stack and is connected to the second doped semiconductor through the first via with the substrate interface surface in the fifth plane. The second electrode has a first portion formed on the perimeter trench valley and is connected to the first doped semiconductor through the second via. The second electrode has a second portion (connected to the first portion) overlying the electrical insulator formed on the perimeter stack, with a substrate interface surface in the fifth plane.

A SM perimeter emission µLED is formed by selectively etching the stack to create a central plateau stack separated from a perimeter stack by a trench moat exposing the first doped semiconductor. The conformally deposited electrical insulator overlies the central plateau stack and the perimeter stack. The step of selectively etching to expose the second doped semiconductor includes etching a portion of the electrical insulator overlying the perimeter stack to expose the second doped semiconductor, and the step of selectively etching to expose the first doped semiconductor includes etching a portion of the electrical insulator, as well as underlying portions of second doped semiconductor and MQW layer in the central plateau stack to expose the first doped semiconductor. As a result, the second electrode is formed overlying the central plateau stack and is connected to the first doped semiconductor through the second via. The first electrode is formed overlying the electrical insulator formed on the perimeter stack, and is connected to the second doped semiconductor through the first via.

A SM µLED full area emission µLED is fabricated by selectively etching the stack to form a plateau stack and a perimeter trench valley in the plateau stack exposing the first doped semiconductor. The step of selectively etching to expose the second doped semiconductor includes etching a portion of the electrical insulator overlying the plateau stack to expose the second doped semiconductor. The step of selectively etching to expose the first doped semiconductor includes etching the electrical insulator overlying the perimeter trench valley. The first electrode overlies the plateau stack and is connected to the second doped semiconductor through the first via. The second electrode includes a first portion overlying the perimeter trench via, and is connected to the first doped semiconductor through the second via. A second portion of the second electrode (connected to the first portion) overlies the electrical insulator formed on a perimeter of the plateau stack, and has a substrate interface surface in the fifth plane.

Also provided is an emissive display substrate with non-planar substrate electrode interfacing surfaces. The display is made up of a support substrate with a planar top surface and a LED cross-point control matrix forming an array of column and row conductive lines. A first thin-film layer overlies the support substrate top surface, and includes a plurality of wells. Each well has a convex bottom surface, a first substrate electrode connected to a corresponding column line, and a second substrate electrode connected to a corresponding row line. A second thin-film layer is interposed between the support substrate top surface and the first thin-film layer. The well bottom convex surface is formed by a shim interposed between the support substrate top surface and the second thin-film layer, underlying each well bottom.

Additional details of the above-described method as well as center, perimeter, full area emission SM micro-LED devices, and an emissive substrate with convex well bottom surfaces are provided below.

DETAILED DESCRIPTION

The general process for making a micro-light emitting diode (μLED) display using inorganic LEDs and fluidic assembly on a display backplane has been reported in the parent applications U.S. Pat. No. 9,825,202 and Ser. No. 15/412,73, which are incorporated herein by reference. In particular, the process flow for making a suitable display backplane is described in U.S. Pat. No. 9,825,202 in the explanation of FIG. 17, and the geometric requirements for fluidic assembly are presented in the explanation of FIG. 16. The devices described herein are a refinement to the surface mount micro-LED structures discussed in the above-referenced patent applications that simplify fabrication of the device while improving the yield and versatility of micro-LED displays.

In U.S. Pat. No. 9,825,202, gallium nitride (GaN) micro-LEDs of two types were described. A structure with the emission area at the center of the device is shown in FIGS. 4A and 4B, and a structure with the emitter in an outer ring is shown in FIG. 5, as described below.

Figure 4A:
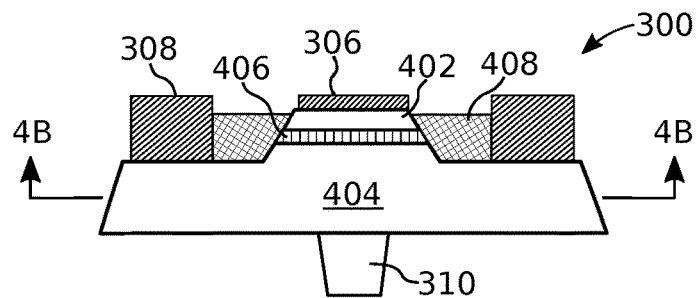
FIGS. 4A and 4B are, respectively, partial cross-sectional and plan views of an emissive element enabled as a surface mount (SM) LED.
Figure 4B:
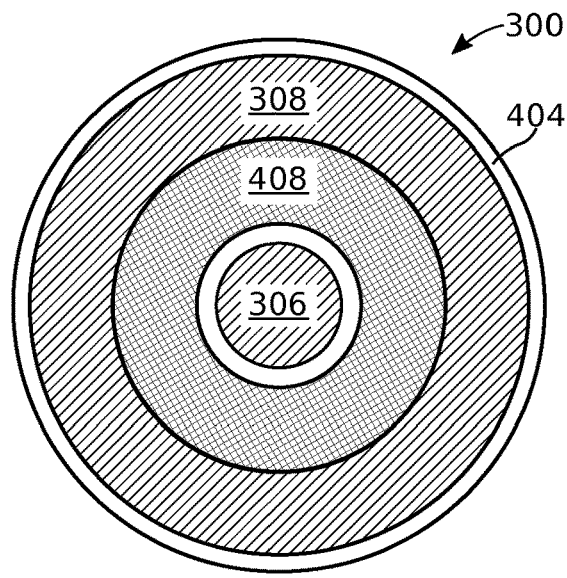
Figure 5:
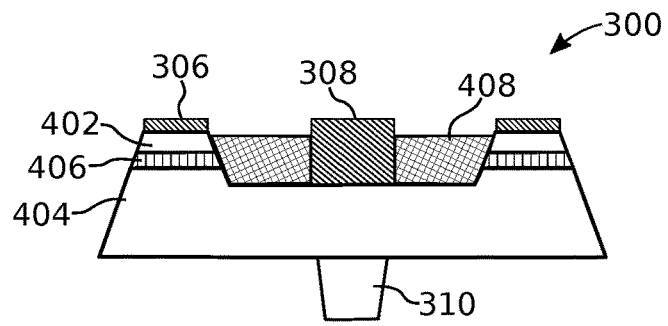
FIG. 5 is a partial cross-sectional view depicting an alternative to the LED of FIG. 4A.
Figure 6A:
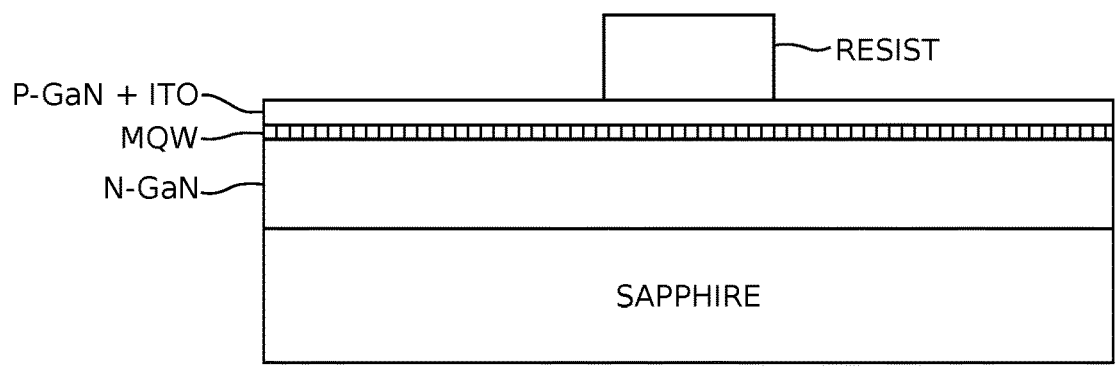
FIGS. 6A through 6J depict steps in the fabrication of a micro-LED as described in U.S. Pat. No. 9,825,202.
Figure 6B:
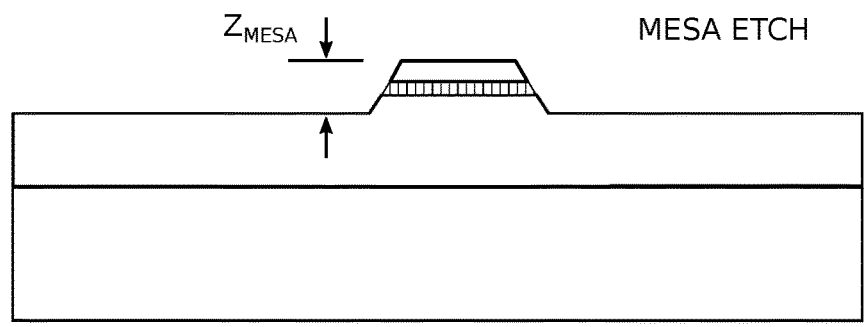
Figure 6C:
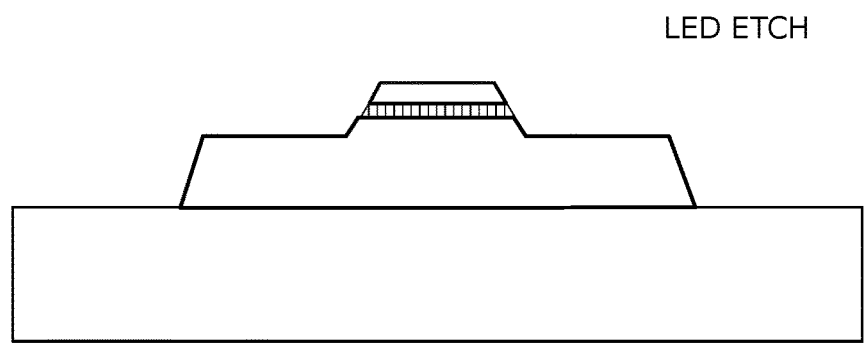
Figure 6D:
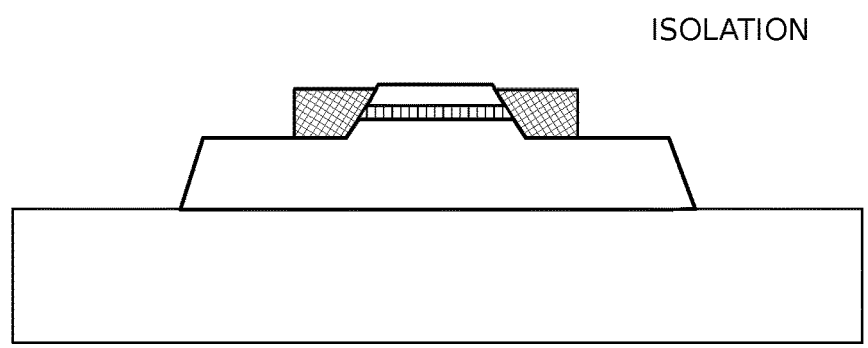
Figure 6E:
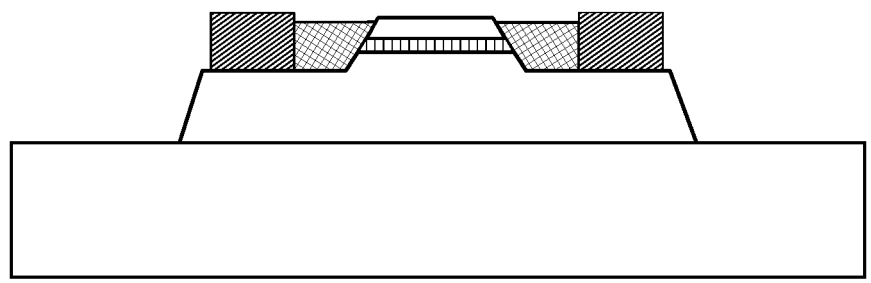
Figure 6F:
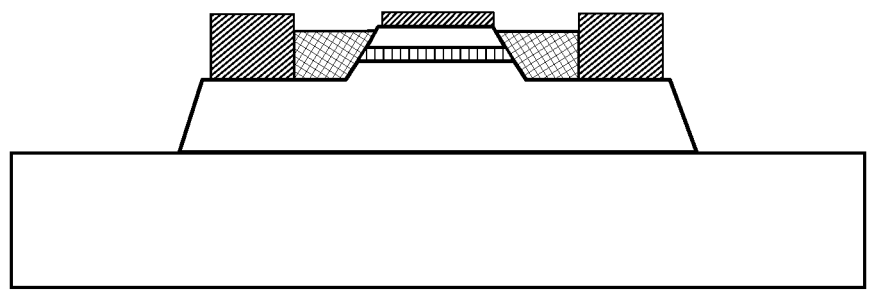
Figure 6G:
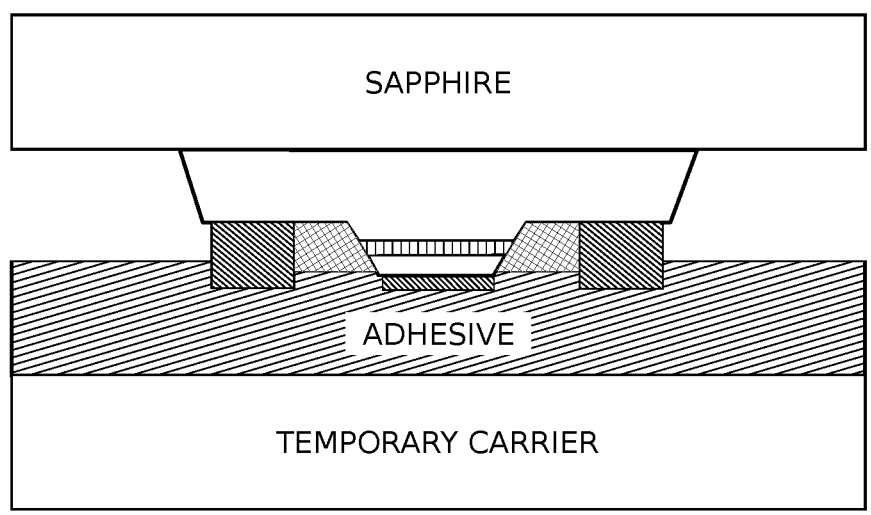
Figure 6H:
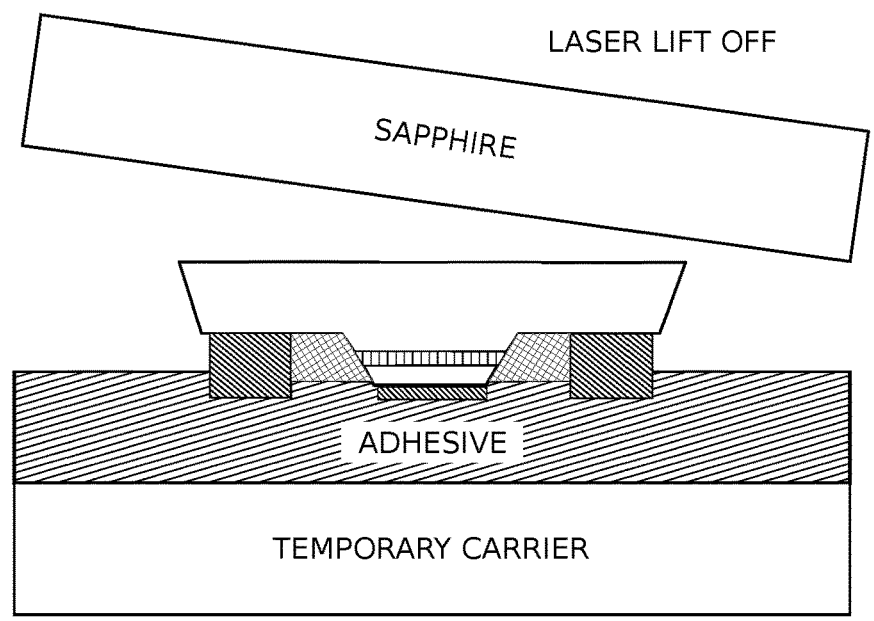
Figure 6I:
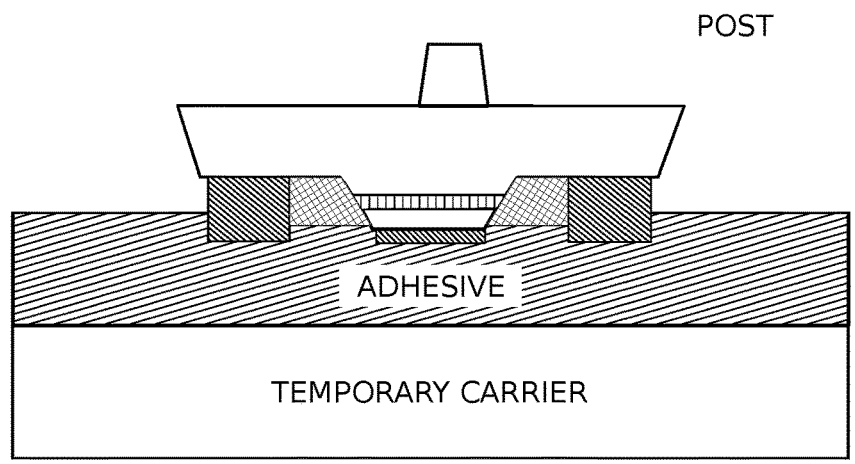
Figure 6J:
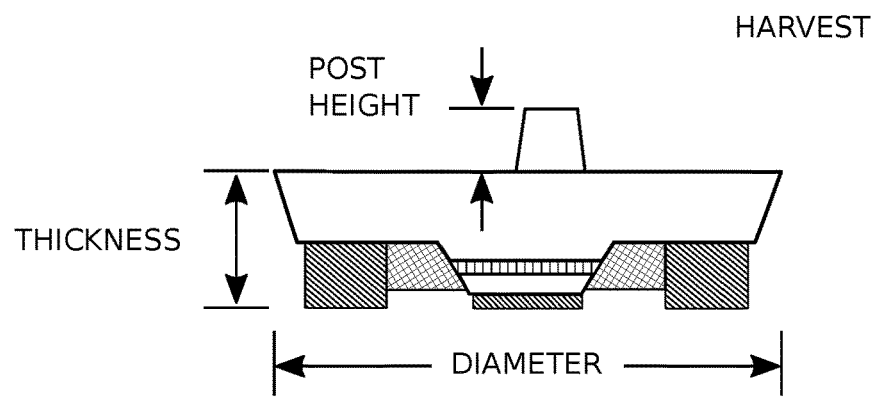

FIGS. 4A and 4B are, respectively, partial cross-sectional and plan views of an emissive element enabled as a surface mount (SM) LED. The SM LED 300 comprises a first semiconductor layer 404, with either an n-dopant or a p-dopant. A second semiconductor layer 402 uses the dopant type that is not used in the first semiconductor layer 404. A multiple quantum well (MQW) layer 406 is interposed between the first semiconductor layer 404 and the second semiconductor layer 402. The MQW layer 406 may typically be a series of quantum well layers (typically 5 layers—e.g., alternating 5 nm of indium gallium nitride (InGaN) with 9 nm of n-doped GaN (n-GaN)) not shown. There may also be an aluminum gallium nitride (AlGaN) electron blocking layer (not shown) between MQW layers and the p-doped semiconductor layer. The outer semiconductor layer may be p-doped GaN (Mg doping) about 200 nm thick. A high-brightness blue LED can be formed, or a green LED if a higher indium content is used in the MQW. The most practical first and second semiconductor layer materials are either GaN, capable of emitting a blue or green light, or aluminum gallium indium phosphide (AlGaInP), capable of emitting red light.

The second electrical contact 308 is configured as a ring, and the first semiconductor layer 404 has a disk shape with a perimeter underlying the second electrical contact ring. The first electrical contact 306 is formed within a second electrical contact 308 ring perimeter, and the second semiconductor layer 402 and MQW layer 406 are a stack underlying the first electrical contact. A moat may be formed between the second electrical contact 308 ring and the first electrical contact 306, filled with an electrical insulator 408.

Conventional LED processing (e.g., LEDs used for lighting) only occurs on one surface prior to separation from the sapphire substrate. Some of these processes use a laser liftoff (LLO) to separate the LEDs from the sapphire substrate as the final step. Other processes do not use LLO, but rather, cut up the sapphire substrate to singulate the LEDs. However, the SM LED architecture requires electrodes on the surface opposite the post (navigation keel), so that the post is made after the uLED is removed from the growth substrate. Conventional processes do not provide a means of maintaining the known position of each LED as the LEDs are removed from the sapphire so that photolithography can be performed on the bottom of the LED. Precise x-y position is required to accurately locate the posts at the desired location on the LED top surface (e.g., in the center). Precise z (vertical) position is required to establish a focal plane for photolithography to image the post structure with the dimensional control required for fluidic assembly (e.g., surface orientation). That is, SM LED LLO requires that the SM LEDs must be located on a transfer substrate in a controlled manner to form their post, and then released from the transfer substrate to make the suspension for fluidic assembly.

FIG. 5 is a partial cross-sectional view depicting an alternative to the LED of FIG. 4A. In this aspect, the first electrical contact (electrode) 306 is configured as a ring, and the second semiconductor layer 402 and MQW layer 406 are a stack underlying the first electrical contact, in the shape of a ring. The second electrical contact 308 is formed within a first electrical contact 306 ring perimeter. The first semiconductor layer 404 has a disk shape with a center portion underlying the second electrical contact. As shown, a moat is formed between the first electrical contact 306 ring and the second electrical contact 308. An electrical insulator 408 fills the moat.

FIGS. 6A through 6J depict steps in the fabrication of a micro-LED as described in U.S. Pat. No. 9,825,202. For consistency in the descriptions, the top and bottom surfaces of the micro-LED are defined with respect to the growth substrate so the micro-LED top surface, which is the last layer grown in the MOCVD process, has the electrodes and the bottom surface has the optional post. Thus, the surface mount configuration for connection to the substrate is bottom side up. For simplicity, it is assumed that the bottom layer in the MOCVD stack is n-GaN and the top layer is p-GaN, but of course the opposite structure is possible as well, with the doping and electrode work functions chosen appropriately. The exemplary fabrication process flow shown schematically in FIG. 6A through 6J is essentially the same for both GaN and GaAs variants, proceeding as follows:

1) An LED stack is deposited on a sapphire wafer by MOCVD as described above. Other substrates such as silicon carbide (SIC) or silicon could be used but sapphire substrates allow the μLEDs to be removed from the growth substrate by laser lift off (LLO), which dissociates GaN at the bottom device surface adjacent to the sapphire substrate. The MQW structure is tuned to produce the desired emission color and the resulting structure is between 2 and 7 μm thick. See also FIG. 1A for examples of the individual layers.
2) A current spreading layer is deposited on the p-GaN surface. The composition is typically a thin $NiO_x$ interface layer plus a transparent conductive oxide such as indium tin oxide (ITO), which may be 100 to 500 nanometers (nm) thick.
3) The emission area is defined by photolithography and the MOCVD stack is etched to a depth extending into the n-doped GaN layer. The etch depth ($Z_{MESA}$) may be from 300 nm to 2 microns (μm) depending on the MOCVD structure. Less than 1 micron is more typical.
4) The μLED area is defined by photolithography and the full stack is etched down to the sapphire substrate. Typically, the pattern is a close-packed array of micro-LEDs to maximize the yield from the MOCVD wafer. The size of the device is chosen to match the width of the trapping sites on the display substrate and is typically in the range of 15 to 150 μm in diameter.
5) An insulating layer, which may be SU8 or a photo patternable polyimide, is deposited and patterned to prevent current leakage between N-pad and P-pad.
6) A lithographic pattern is formed to prevent metal deposition outside the N-pad area and a metal layer is deposited to build up the electrode to match the height of the P-pad. The first layer is chosen to match the work function of n-doped GaN, which may be Ti or Cr from 10 to 50 nm thick. The buildup is completed by depositing gold of the proper thickness to match the height of the active area mesa.
7) Metal and photo resist are removed by liftoff, leaving the buildup over the n-GaN contact area.
8) Lithography is performed to prevent deposition outside N-pad and P-pad contact areas, and the metal stack is deposited to connect to the μLED contact openings.
   a. The first metal is chosen as a conductive barrier between the buildup and solder material, which may be chromium/gold (Cr/Au) or titanium/nickel (Ti/Ni) with a total thickness of 100-200 nm.
   b. The top layer is a low melting temperature solder that can bond to the substrate electrode. One system is tin (Sn) alloy, like Sn—In, Sn—In-silver (Sn—In—Ag), and Sn—Ag-antimony (Sn—Ag—Sb) where the solder metal chosen is similar to conventional low melting point solder materials. Another metal solder system is Au/germanium (Au/Ge).
9) The excess metal is removed by a lift off process.
10) The completed wafer top side is bonded to a temporary carrier with an adhesive layer and the sapphire growth wafer is removed by LLO.
11) Now the μLEDs are bottom up on the temporary carrier in a planar array that is suitable for further processing. For clarity, the convention is maintained of identifying the top and bottom surfaces of the micro-LED based on the original growth orientation.
12) Optionally, the n-GaN may be etched to reduce the thickness of the micro-LED.
13) Post structures, also known as navigation keels, for fluidic assembly may be fabricated on the bottom near the center of the micro-LED. The post may be cylindrical, conical, or reentrant shape with the post height and diameter chosen to facilitate bottom side up orientation of the μLED in the fluidic assembly process, as is explained in more detail below.
14) Finally, the completed μLEDs are harvested into a suspension by dissolving the adhesive using a suitable solvent.

Figure 8A:
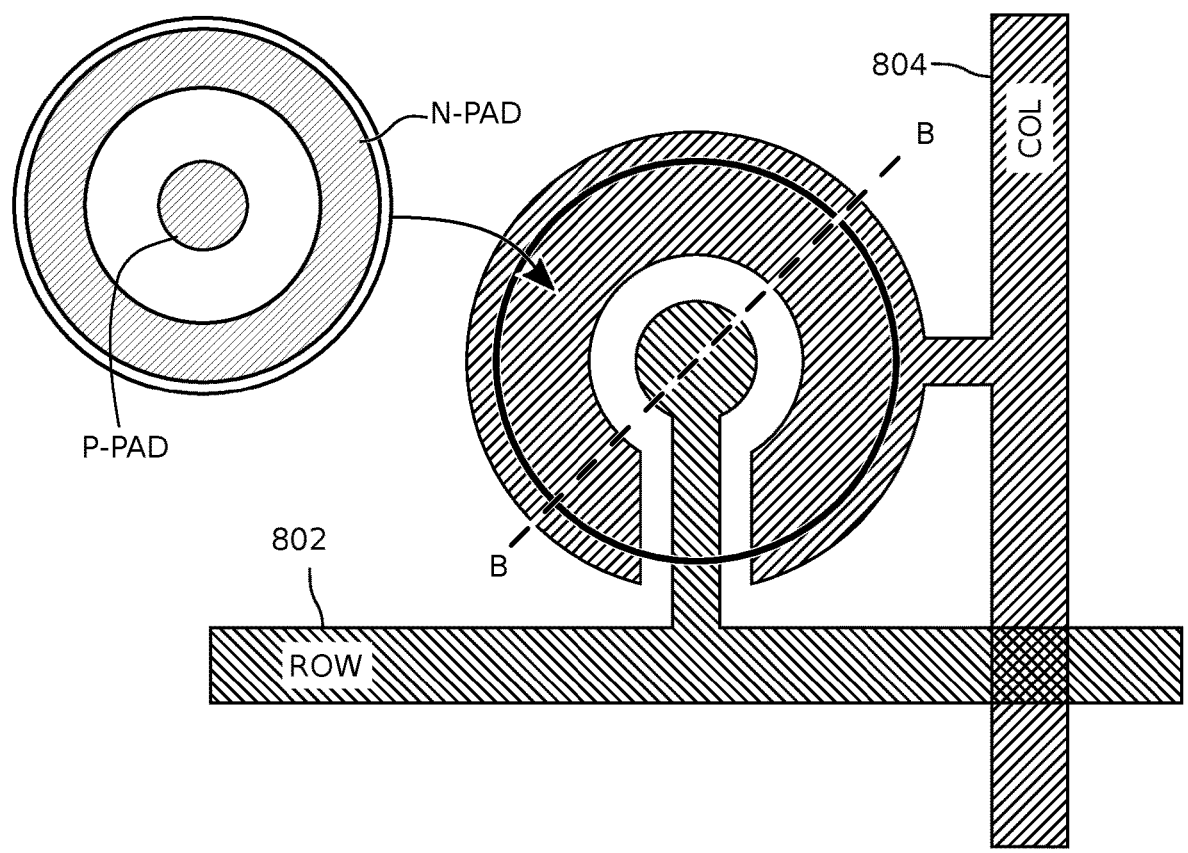
FIGS. 8A and 8B are, respectively, plan and partial cross-sectional views of a micro-LED sub-pixel layout.
Figure 8B:
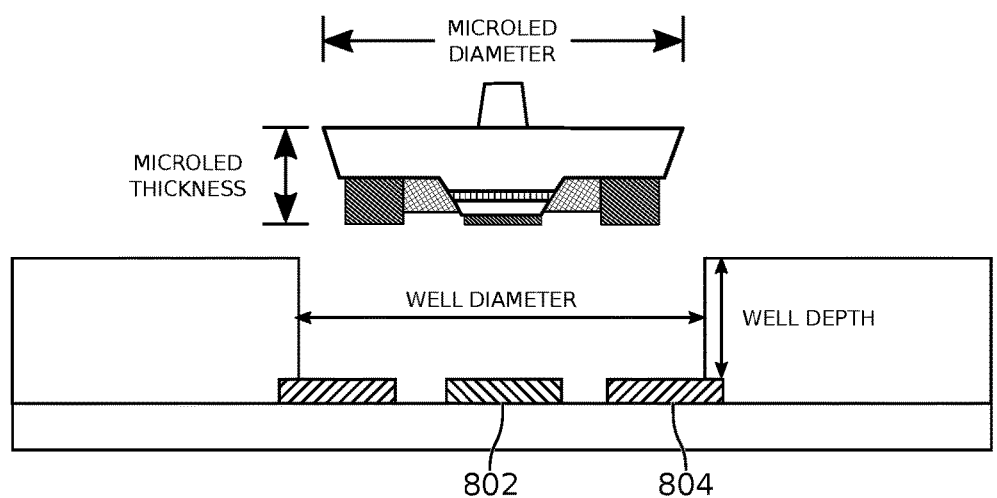

The micro-LEDs that result from the fabrication process all have critical dimensions such as diameter, thickness, and post height, as well as the size and arrangement of the electrodes, configured to match the geometry of the wells and electrodes on the display substrate so that the micro-LED can be assembled and bonded with the P-pad and N-pad electrodes, which in turn are connected to display substrate row and column interfaces, respectively. Each subpixel is constructed with two electrodes on the substrate centered in a trap structure with vertical walls (also referred to as a well) as shown in FIGS. 8A and 8B. Disk shaped micro-LEDs and matching circular wells and electrodes are shown for simplicity, but other shapes such as squares or triangles can be used as long as the shapes are engineered to match complimentary shapes in the substrate so that both micro-LED electrodes are electrically connected to the correct substrate electrodes without shorting.

Fluidic assembly of micro-LEDs proceeds by dispensing micro-LEDs in a liquid suspension over the display substrate. Some examples of suspension components include water, alcohols, ketones, alkanes, and organic acids. The fluid is disturbed by some means such as a brush or a blade, or a stream of solvent or gas to produce liquid flow across the substrate. As the micro-LEDs move over the substrate there are many trapping attempts as the micro-LEDs are caught and held in the substrate well structures to create a self-assembled array of micro-LEDs precisely positioned with surface mount electrodes in contact with the electrical interfaces (substrate electrodes) in the substrate wells. When fluidic assembly is complete, as determined by an in-situ monitoring system that may use a camera and machine vision algorithms to determine assembly yield, the suspension fluid is removed and the display is completed by annealing to form a solder bond between micro-LEDs and the substrate electrodes. Fluidic assembly is inherently a random process, so the device and trap dimensions, as well as the assembly process parameters, are selected based on statistical analysis of trapping effectiveness.

Figure 7A:
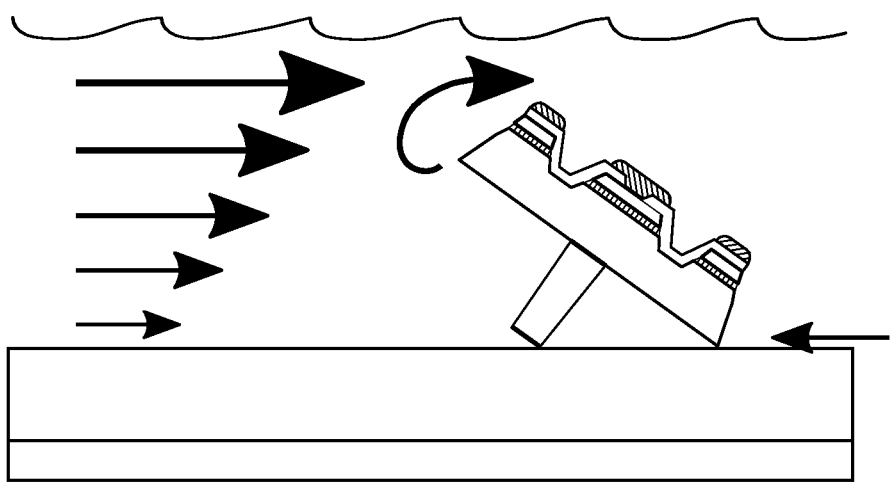
FIGS. 7A through 7C depict a suspension medium applying torque to a micro-LED enabled with a navigation keel (post).
Figure 7B:
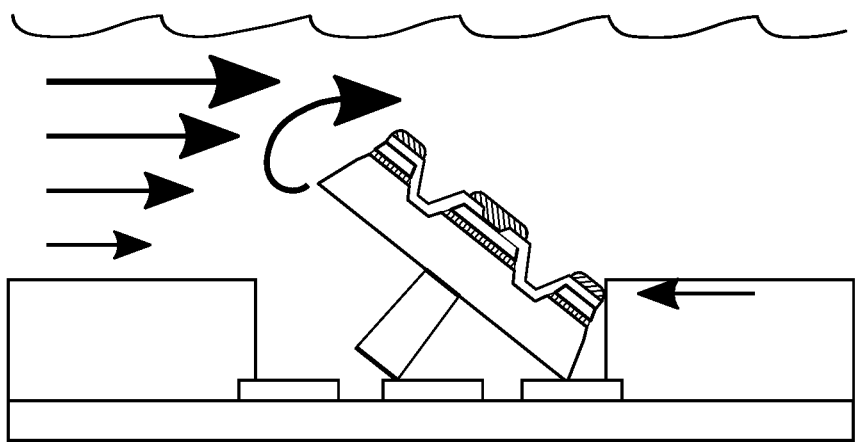
Figure 7C:
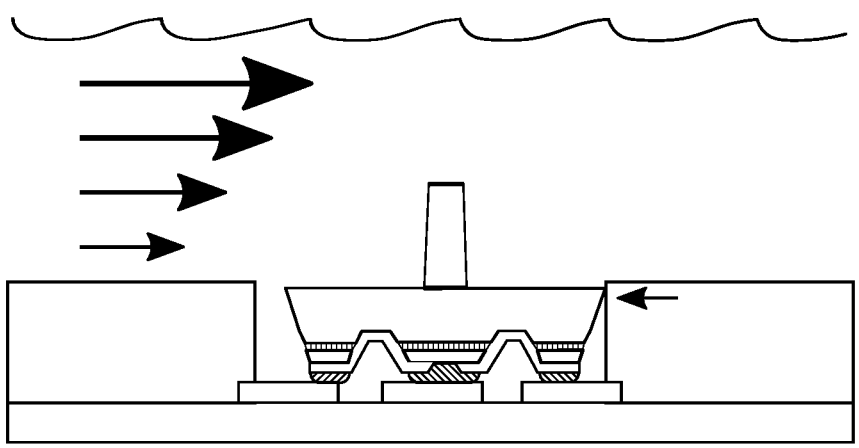

FIGS. 7A through 7C depict a suspension applying torque to a micro-LED enabled with a navigation keel (post). It is well known that fluid velocity increases parabolically from zero at the confining surface, so the force on a micro-LED increases with increasing distance from the substrate top surface. When the suspension is first distributed over the substrate, micro-LEDs can be disbursed relatively quickly before settling onto the substrate surface. After reaching the substrate, micro-LEDs continue to move under the influence of the fluid flow, so a device with post down as shown in FIG. 7A experiences a torque that tends to flip the orientation so the electrodes are down and the post is up. Similarly, if the micro-LED enters a well with the post down (FIG. 7B), the post prevents the disk from being captured, and the force on the disk tends to tip the micro-LED out of the well and flip the orientation to electrode down. If a micro-LED is captured in a well with post up as in FIG. 7C, the resultant net force exerted by fluid flow is much less because of the smaller cross-sectional area of the post, so the probability of de-trapping is low. Successful fluidic assembly requires appropriately processing the micro-LED such that its most stable configuration is also the correct location and orientation for bonding to the substrate.

FIGS. 8A and 8B are, respectively, plan and partial cross-sectional views of a micro-LED sub-pixel layout. Each micro-LED sub-pixel in the display array is driven by a voltage applied to two electrodes arranged in a cross-point matrix of row and column lines, 802 and 804 respectively. In typical flat panel display manufacturing the row and column interconnect lines are aluminum or copper thin films between 200 and 1500 nm thick. The amount of light emitted by a given micro-LED is governed by the amount of current supplied from an external driver chip, and the resistance of a TFT control circuit (not shown) that is part of the sub pixel. A key point for the purposes of micro-LED manufacturing is that the two electrodes on the SM micro-LED must be bonded to the substrate electrodes with low resistance to allow the correct amount of current to flow through the micro-LED. The substrate electrodes are chosen for low resistance and compatibility with the solder layer on the micro LED. In one case the substrate electrodes are copper between 200 and 1000 nm thick to form a copper-tin intermetallic with the tin based solder layer. Of course the opposite arrangement, with solder on the substrate electrode and gold electrodes on the micro-LED, is also possible. It can be seen from FIG. 8B that successful fluidic assembly requires that the micro-LED diameter be less than the diameter of the well, so the micro-LED can be captured and bonded to the substrate electrodes.

Figure 9A:
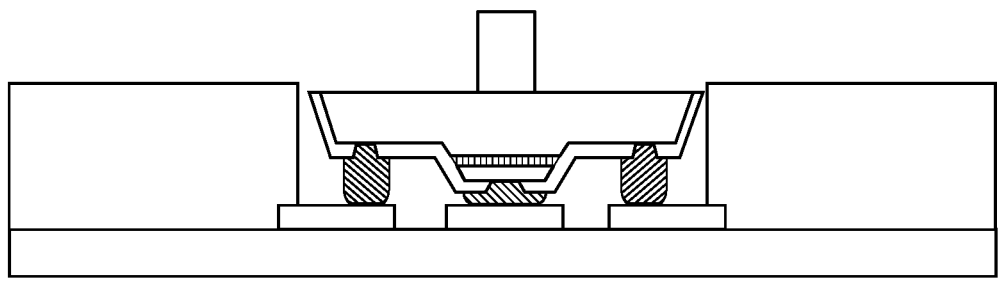
FIGS. 9A through 9E are partial cross-sectional views depicting micro-LED alignment in exemplary well variations.
Figure 9B:
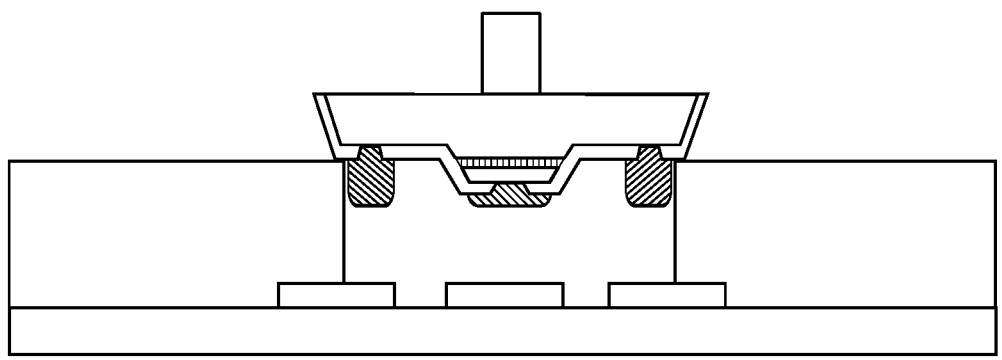
Figure 9C:
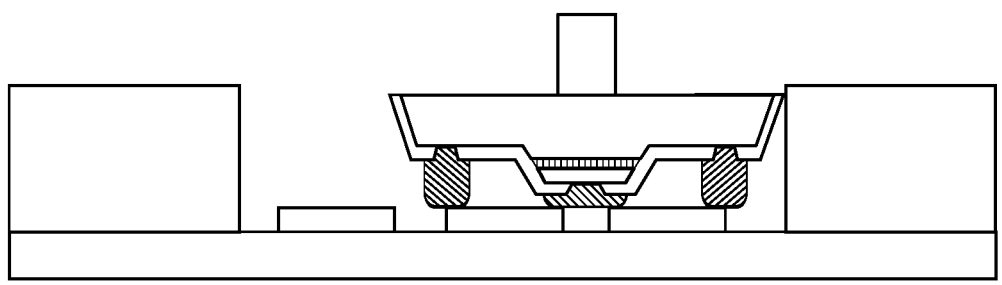

FIGS. 9A through 9E are partial cross-sectional views depicting micro-LED alignment in exemplary well variations. FIG. 9A depicts a well diameter slightly larger than the micro-LED diameter, which makes for favorable alignment and bonding. In FIG. 9B unfavorable alignment and bonding is caused by the well being too small, preventing electrical contact between the micro-LED and substrate. In FIG. 9C the well diameter is so large that it permits the LED electrode to cause a short between the row and column substrate electrodes.

All of these dimensions are the result of using relatively routine photolithography processes to control sizes by mask design, film thickness, and photoresist exposure. The deposition thickness for the buildup is chosen to match the depth of the mesa etch (see FIG. 6B), which defines the central active region, so the target thickness must be determined by measuring the etch depth. The GaN etch is performed in a single wafer chamber so the etch rate can vary between successive wafers by as much as 10-20%. In addition, the etch rate is not perfectly uniform across the wafer, with as much as an additional 10-15% variation from center to edge. As a result, the height of the center mesa ($Z_{MESA}$) may have a range of as much as 400 nm for an etch with a nominal target of 1 micron. Deposition of the buildup metal is by evaporation or sputtering, typically in a batch process with many wafers processed together so a separate deposition thickness for each wafer is not feasible. For this situation the target thickness of the buildup deposition is chosen as the mean value of $Z_{MESA}$ for all the wafers, regardless of the above-mentioned differences in etching, and the result is too thick a buildup for some wafers, and too thin for others. As a consequence of the variations in GaN etch and buildup metal deposition, the final structure N-pad (electrode connected to the n+ semiconductor) and P-pad (electrode connected to the p+ semiconductor) may not lie in the same plane. This difference varies form one micro-LED to another and may amount to as much as 600 nm, which can have a significantly negative impact on yield and reliability in the electrical connections between the micro-LED and the substrate contacts.

Figure 9D:
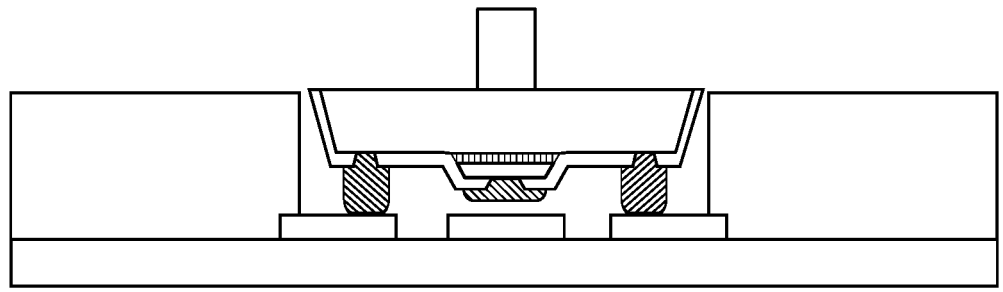

In FIG. 9D the micro-LED N-pad on the perimeter is too thick, so that the center electrode (P-pad) of the micro-LED does not make contact with the substrate electrical interface, because the heights of the N-pad and P-pad are not co-planar. The result is a dark pixel caused by poor control over electrode planarity. Conversely, in FIG. 9E the N-pad on the perimeter is too "low" with respect to the center electrode, causing incomplete contact of the electrode with the mating substrate electrical interface. The tilted micro-LED results in contact between the N-pad and the substrate electrode that is limited to just a small area, rather than around the full perimeter. Small areas of contact can increase series resistance and decrease the reliability of electrical connections. To prevent the described alignment and bonding failure mechanisms, it would be advantageous to make a micro-LED in such a way that the P-pad and N-pad electrodes are always at the correct relative co-planar height, to make optimum contact with the substrate electrodes.

Figure 10A:
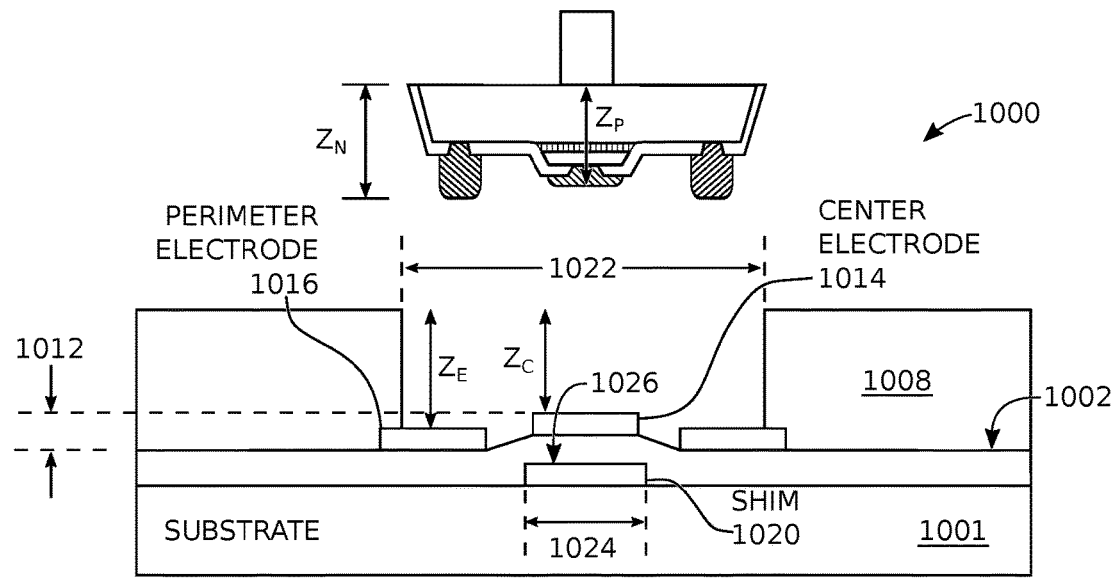
FIGS. 10A through 10C are partial cross-sectional views of a substrate well and mating micro-LED, illustrating a well bottom surface shim.
Figure 10B:
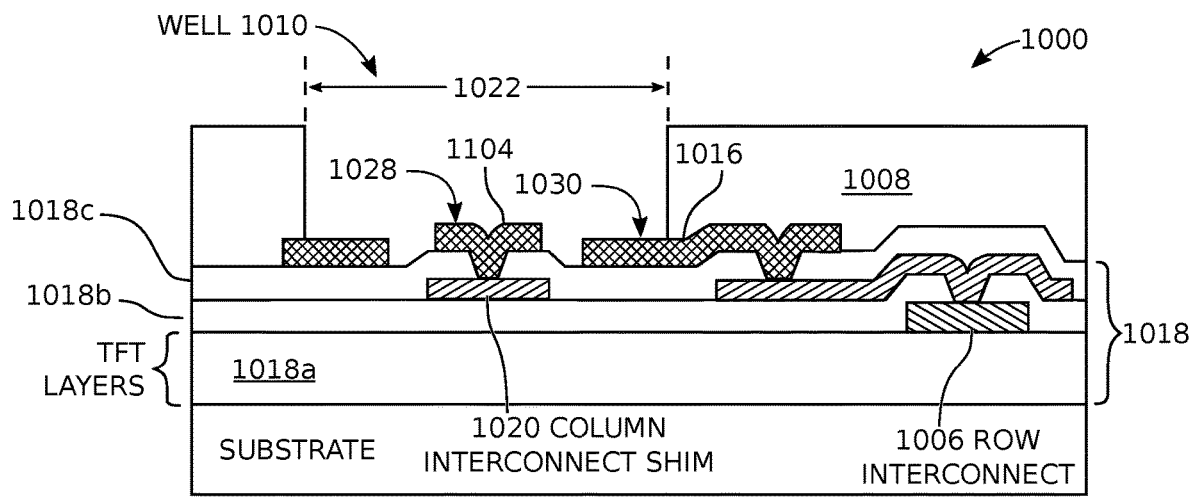
Figure 10C:
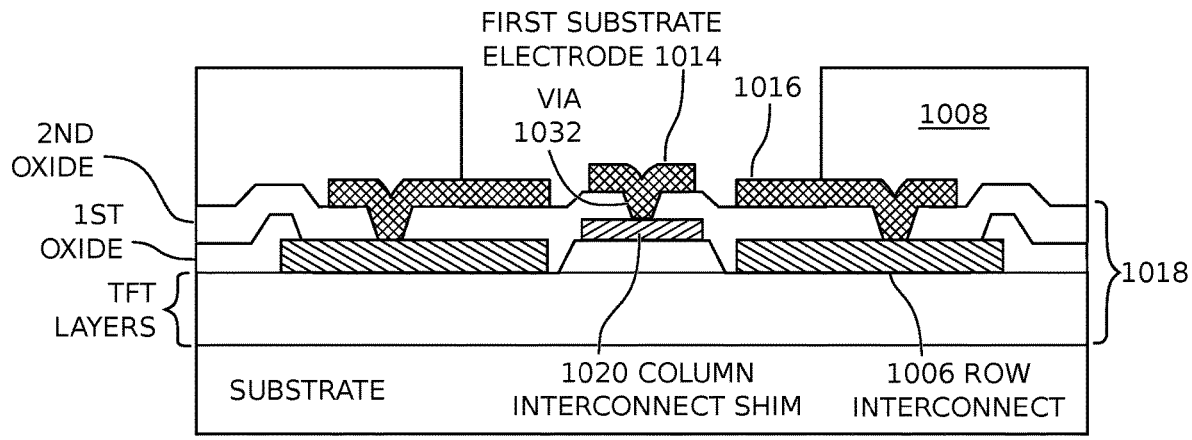

FIGS. 10A through 10C are partial cross-sectional views of a substrate well and mating micro-LED, illustrating a well bottom surface shim. The emissive display substrate 1000 comprises a support substrate 1001 with a planar top surface 1002 and an LED cross-point control matrix comprising an array of column and row conductive lines. Since only one LED is depicted, there is only a single set of column and row lines, respectively shown as 804 and 802 in FIG. 8A. Active and passive matrix systems are explained in detail in U.S. Pat. No. 9,825,202, which is incorporated herein by reference. As explained in the Background Section above, an emissive display substrate typically comprises millions of LEDs. A first thin-film layer 1008 overlies the support substrate top surface 1002. Again, only a single well 1010 is shown. Each well 1010 has a convex bottom surface as represented by reference designator 1012, with a first substrate electrode 1014 connected to a corresponding column line (804, see FIG. 8A), and a second substrate electrode 1016 connected to a corresponding row line (802, FIG. 8A).

A second thin-film layer 1018 is interposed between the support substrate top surface and the first thin-film layer. As shown in FIGS. 10B and 10C, the second thin-film layer may be composed of a TFT layer 1008a, containing thin-film transistors (TFTs), not shown, and interconnects to either a row of column line, such as would be required to enable an LED. The second thin-film layer may also be comprised of oxide or insulating layers, first oxide layer 1008b and second oxide layer 1008c are shown as an example. A shim 1020 is interposed between the support substrate top surface 1002 and the second thin-film layer 1018, underlying each well bottom. The shim 1020 may be either an insulating material, as implied in FIG. 10A, or an electrical conductor, as shown in FIGS. 10B and 10C. The first thin-film layer wells 1010 each have a diameter 1022 or cross-section (in the case on non-circular LEDs). The shim 1020 has a width 1024 less than the diameter 1022, and a top surface 1026. The well convex bottom surface 1012 is responsive to the difference in height between the shim top surface 1026 and the support substrate top surface 1002.

As shown in all the examples, the first substrate electrode 1014 is a center substrate electrode having a first electrical interface surface 1028 for electrical connection to a micro-LED, and the second substrate electrode 1016 is a perimeter substrate electrode having a second electrical interface surface 1030, lower than the first electrical interface surface, as defined with respect to the support substrate top surface 1002, also for electrical connection to a micro-LED. As explicitly shown in FIGS. 10B and 10C, the shim is formed directly overlying the column line, forming column interconnect shim 1020. The first substrate electrode 1014 is a center substrate electrode overlying a via 1032 and is connected to the column interconnect shim 1020.

Figure 9E:
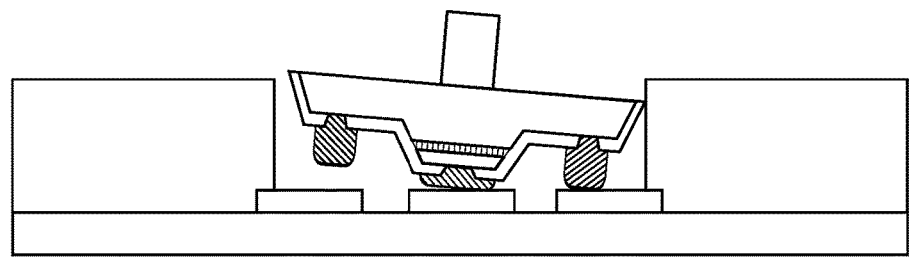

Several strategies can be used to match the micro-LED electrodes with the structure of the electrical interface on the display substrate to facilitate solder bonding. As shown in the figures, an additional shimming structure can be added to the substrate under the center substrate electrode, to raise it above the outer ring substrate electrode by the thickness of the shim layer. The shim may be made from a metal film used elsewhere for interconnects such as aluminum or copper, or an insulating layer, and the thickness can be from 50 to 500 nm. If the shim is conductive it is separated from the center substrate electrode by an interlayer dielectric as shown. Alternatively, the center and edge substrate electrodes can be fabricated separately with layers of different thickness. The result is that the center and edge electrodes are no longer co-planar and the height difference is $D_{sub}=Z_C-Z_E$ (FIG. 10A). It can be seen that the substrate electrode structure best matches the micro-LED when the electrode height $D_{LED}=Z_P-Z_N$ is equal to $D_{SUB}$. So this structure compensates for "low" P-pad (center) electrodes for any case where $D_{LED}<D_{SUB}$, but at the cost of increased complexity and variability. Of course, for micro-LEDs with "high" P-pad electrodes ($D_{LED}>0$), this structure would have a lower performance and cause a decrease in contact area as shown in FIG. 9E.

The shim may be made in a variety of ways so long as the heights of the substrate electrode, typically 50 to 500 nm, and height differences are appropriate for interfacing with a micro-LED. In the case of an active matrix display (e.g., FIG. 10B), the micro-LED wiring is constructed over the layers used to fabricate TFTs (not shown). Micro-LED wiring consists of metal interconnect lines arranged in rows and columns which are connected to the substrate interface electrodes. Row and column interconnect lines are typically copper or aluminum for low resistance, and the lines are 100 to 900 nm thick. So the electrode connects can pass over each other without shorting, as the metal layers are separated by insulating layers, typically of silicon oxide. In FIG. 10B, first oxide layer 1018a separates column and row interconnect lines (804 and 802, see FIG. 8A), while the second oxide layer 1018c separates the column interconnect from the first substrate electrode, and connections between levels are made by an appropriately placed via 1032. In FIG. 10B the shim underlying the center substrate electrode is made from the same metal film used to make column interconnect lines, so the center substrate electrode is raised by the thickness of that film. In FIG. 10C an alternate strategy is used where the height of the center substrate electrode is increased by the thickness of the first oxide layer and the column interconnect layer.

Using the above described shim, a micro-LED with a "tall" perimeter electrode, as shown in FIG. 9D, can successfully mate with the convex well bottom structures shown in FIGS. 10A, 10B, and 10C. However, even if the micro-LED center and perimeter electrodes are planar, as shown in FIG. 9A, or the micro-LED center electrode is "taller" than the perimeter electrode, as shown in FIG. 9E, the micro-LED electrodes will be able to the substrate electrodes, at the cost of a higher current resistance and reduced contact area.

Disclosed in more detail herein is a simpler and more effective approach to fabricating micro-LEDs electrodes having equal (co-planar) substrate interface surfaces. To avoid the tolerance problems associated with first etching portions of an MOCVD stack, and then depositing and patterning thin-films, the inherently co-planar MOCVD stack is advantageously used as a mechanical component to elevate the N-pad electrode to the same level as the P-pad ensuring that $D_{LED}=0$. MOCVD growth of GaN and AlGaInP is a process of heteroepitaxy, where the crystalline structure is built up layer by layer templated by the underlying structure. Unlike the physical deposition process described above, which often has significant topological variations caused by grain growth, successful heteroepitaxy results in a surface that is locally (less than or equal to the micro-LED diameter) flat (planar) to within at most a few atomic layers. Similarly, the insulating layer, typically silicon dioxide deposited by plasma-enhanced chemical vapor deposition, is smooth and locally (as defined above) planar. Thus, the fourth plane, which serves as the base for the surface mount electrodes is inherently low in variability, typically less than 10 nanometers. Surface mount electrodes with the low melting point solder as described above are deposited on the fourth plane and the final electrode interface surfaces are in the same fifth plane. Global variability in the electrode deposition thickness results in micro-LEDs of different thickness, but when considered locally, all micro-LEDs have both of the surface mount electrode interface surfaces in the same (fifth) plane. Unlike CVD processes, the physical vapor deposition (PVD) of metals results in a solder surface that has some roughness due to agglomeration and grain growth. So the final surface may have surface roughness on the order of a 10 to 100 nm. In consideration of this potential surface roughness, the micro-LED electrode interface surfaces may be said to have an average fifth plane tolerance of 10 nm. Since the fabrication of the micro-LED is such that $D_{LED}$ is always zero, then there is no advantage to the shim structure of FIG. 10 and the display substrate can be fabricated with $D_{SUB}=0$.

Figure 11A:
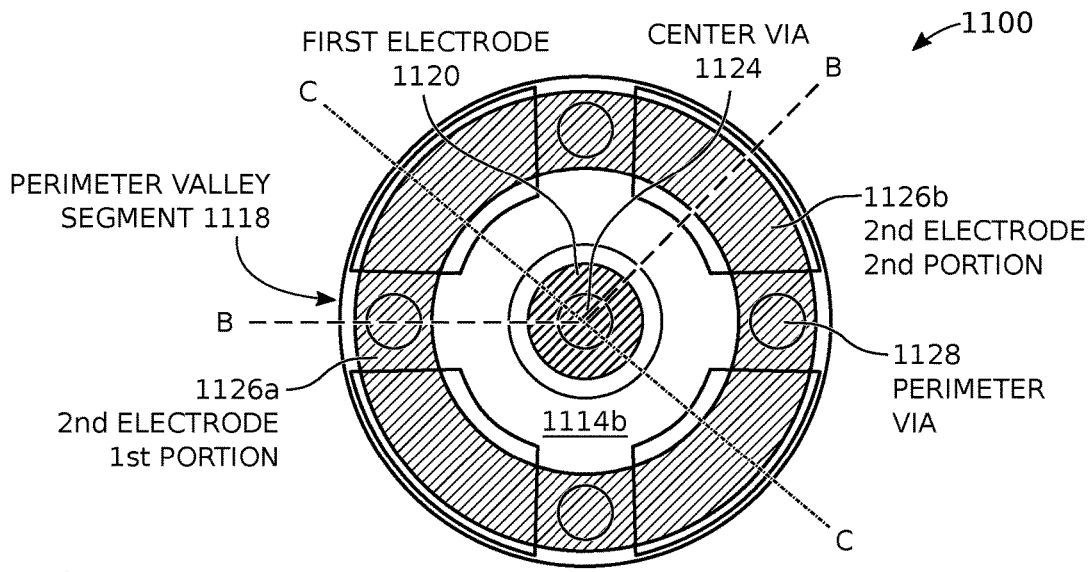
FIG. 11A through 11D are, respectively, a plan view, two partial cross-sectional views, and a perspective view of a planar SM center emission μLED.
Figure 11B:
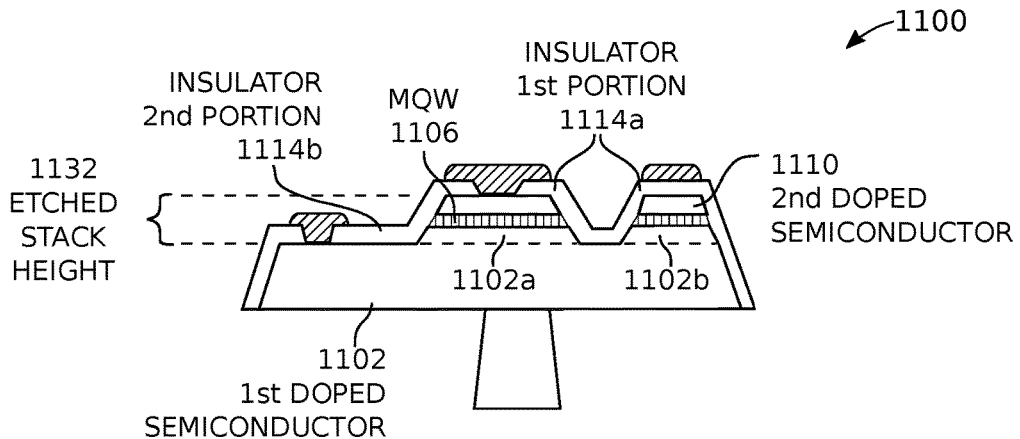
Figure 11C:
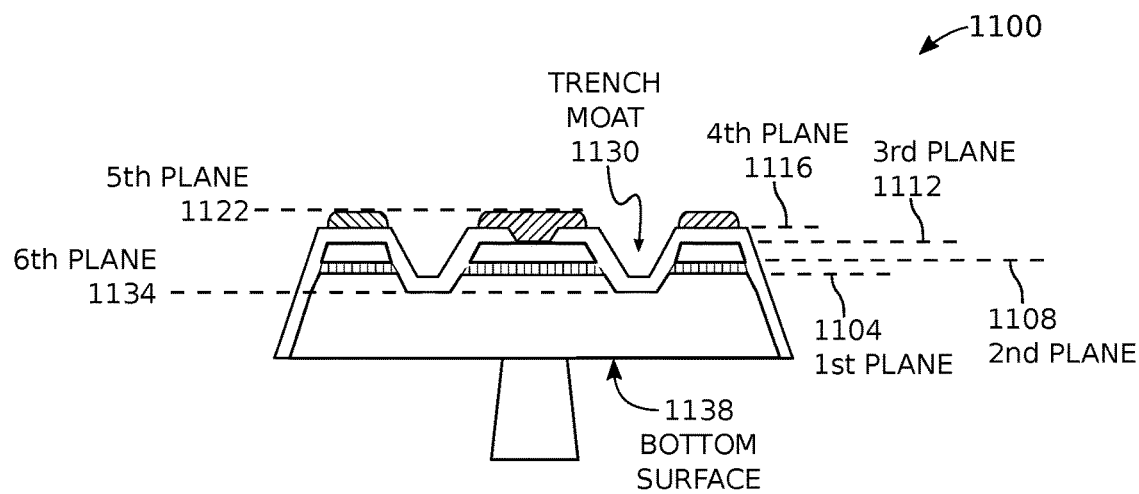
Figure 11D:
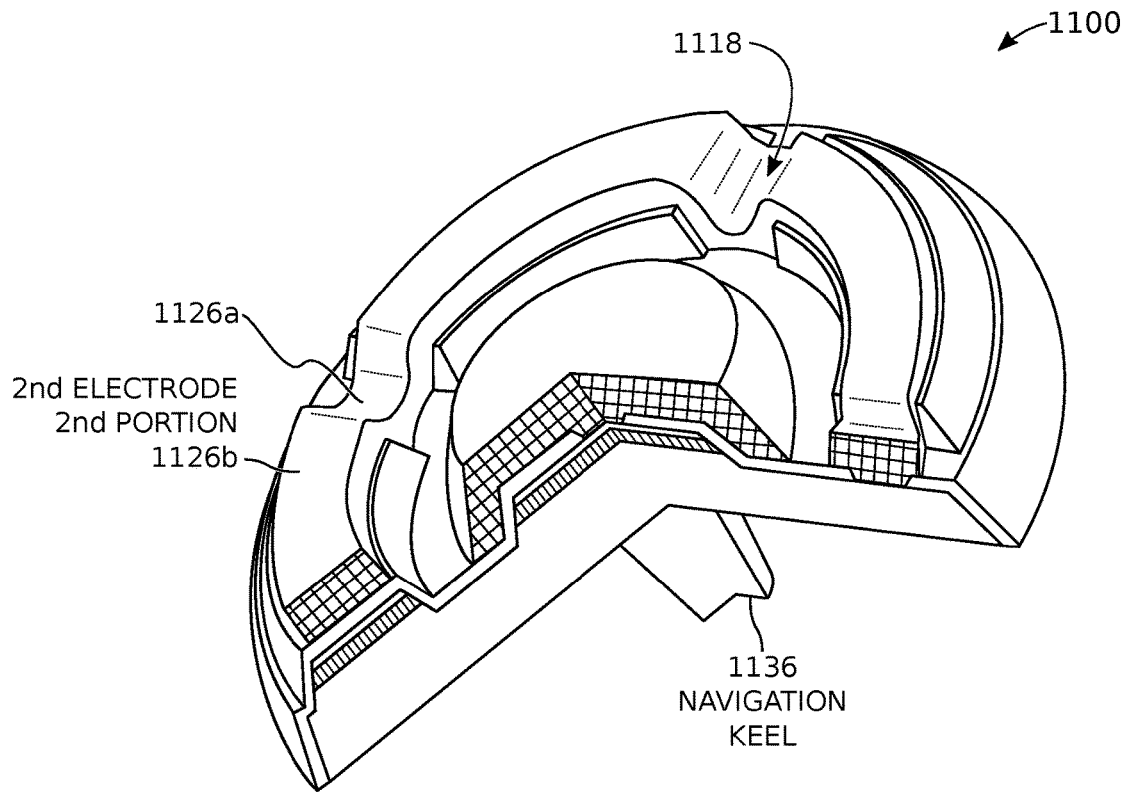

FIG. 11A through 11D are, respectively, a plan view, two partial cross-sectional views, and a perspective view of a planar SM center emission µLED. The center emission µLED 1100 comprises a first doped semiconductor 1102 formed as a base and doped with either an n or p dopant. As shown in FIGS. 11A and 11C, the first doped semiconductor base 1102 has a circular perimeter in this example, but is not limited to any particular shape. The first doped semiconductor 1102 has a top surface formed in a first plane 1104 comprising a center plateau 1102a (distinguished by the phantom line) separated from a perimeter 1102b (distinguished by a separate phantom line). A MQW layer 1106 (typically formed as several sub-layers) has a top surface formed in a second plane 1108 overlying the first doped semiconductor center plateau 1102a and perimeter 1102b. A second doped semiconductor 1110, doped with the opposite dopant than that used in the first doped semiconductor 1102, is formed as a layer having a top surface in a third plane 1112 overlying the MQW layer 1106.

An electrical insulator has a first portion 1114a formed as a layer with a top surface in a fourth plane 1116 overlying the second doped semiconductor 1110, and a second portion 1114b overlying a perimeter trench valley 1118 segmenting the perimeter 1102b. A key function of the insulator is to prevent current leakage between the first and second doped semiconductors. A first electrode 1120 overlies the center plateau, is connected to the second doped semiconductor 1110 through a center via 1124, and has a substrate interface surface in a fifth plane 1122. A second electrode has a first portion 1126a formed on the perimeter trench valley 1118 and is connected to the first doped semiconductor 1102 through a perimeter via 1128. The second electrode has a second portion 1126b overlying a perimeter of the electrical insulator first portion 1114a and is connected to the second electrode first portion, and it has a substrate interface surface in the fifth plane 1122.

The SM center emission µLED 1100 further comprises a trench moat 1130 formed in the first doped semiconductor 1102 separating the center plateau 1102a from the perimeter 1102b. The trench moat 1130 and perimeter trench valley 1118 have top surfaces formed in a sixth plane 1132 underlying the first plane 1104.

In one aspect, the first doped semiconductor 1102 and second doped semiconductor 1110 are doped GaN. Alternatively, the first doped semiconductor 1102 and second doped semiconductor 1110 are either p-doped gallium phosphide (p-GaP) or n-doped gallium indium phosphide (n-GaInP). Technically, the doped semiconductors may also be n-GaP and p-GaInP, but they are less practical.

Although not explicitly shown, the GaN devices may optionally include electron and hole injection and blocking layers, as is well known in the art. In the case of GaAs devices, optional p and n cladding layers may be used, which are also well known in the art. In general, for both red and blue micro-LEDs it is desirable to maximize the residence time of electrons and holes in the MQW layers. Considering only the anode side for instance, it is desirable to prevent electrons from leaving, so the electron blocking layer (AlGaN) has a high barrier to electrons in the conduction band. It is also desirable that holes easily enter, so a separate hole injection layer may be added over the electron blocking layer to grade out the little discontinuity in the valence band. In the AlGaInP case, the n and p cladding layers have the same purpose but are referred to as window and cladding layers for historic reasons.

As shown, the SM center emission µLED 1100 may comprise a plurality of first doped semiconductor perimeter segments 1102b separated by a plurality of perimeter trench valleys 1118. In that case, the MQW layer 1106, second doped semiconductor 1110, and electrical insulator first portion 1114a overlie each first doped semiconductor perimeter segment 1102a. The second electrode first portion 1126a is formed on each perimeter trench valley 1118 and is connected to the first doped semiconductor 1102 through a corresponding perimeter via 1128. The second electrode second portion 1126b overlies segmented perimeters of the electrical insulator first portion 1114a with a substrate interface surface in the fifth plane 1132.

The first doped semiconductor 1102, MQW layer 1106, and second doped semiconductor 1110 form an etched stack having a height 1134 orthogonal to the first plane 1104, second plane 1108, and third plane 1112 of less than 2 microns, with the planarity tolerance of the first, second, third, and fourth planes being less than 10 nanometers. The electrode interface surfaces in the fifth plane have an average planarity tolerance of less than 10 nm, as described above. Rather than relying on the greater tolerances inherent in using thin-film buildup processes to form planar electrode surfaces, as described in FIGS. 6A-6J, the devices described herein use the preexisting planar surfaces of the MOCVD stack. Thus, even if there are differences in stack etching between dies on the wafer, or between wafers, the MOCVD planes act to maintain planarity between the substrate interface surfaces of the electrodes that are eventually formed. In short, the micro-LED 1100, as well as the micro-LEDs 1300 and 1400 presented below, may be described as a device where the electrodes are formed overlying an etched MOCVD wafer (i.e., the etched stack) without any subsequently deposited intervening semiconductor layers.

In one aspect, not shown, a solder layer forms part of the first and second electrode interface surfaces, and is made from an alloy such as indium/tin (In/Sn) or gold/germanium (Au/Ge). Alternatively, the substrate interface surfaces of the first and second electrodes are gold. Optionally as shown, a navigation keel or post 1136 is attached to the first doped semiconductor base bottom surface 1138.

As shown in FIG. 11A, this exemplary center emitter design uses four equally spaced island structures supporting segments of the ring-shaped N-pad electrode. One key factor in the design is that the N-pad and P-pad electrodes are co-planar. Note also that the island (perimeter) structures are not electrically active and are isolated from the N-pad electrode by an insulator, so connections to the N-pad electrode are made through 4 contacts spaced between the islands. The number of islands is typically from one to six or more depending on the size of the micro-LED, but provision is made for at least one opening in the island structure for a contact to the N-doped region. Fewer contacts allow a larger area for solder contact to the substrate electrodes, but increase the spreading resistance in the n-doped layer. Conversely, the more openings between the islands, the smaller the resulting area for making contact between the micro-LED and the substrate electrodes. In one aspect it has been found that three or four island/contacts is preferred for the best trade-off between series resistance and bonding strength.

The process flow for the current invention is similar to the prior art flow presented above, with the photo, deposition, and liftoff steps associated with the N-pad buildup (Steps 6 and 7 above) removed, so cost and complexity is decreased while producing a micro-LED with perfectly co-planar surface mount electrodes. An exemplary process flow to fabricate a GaN based micro-LED of the current design proceeds as follows:

1) An LED stack is deposited on a sapphire wafer by MOCVD as described above. Other substrates such as SiC or silicon can be used, but sapphire substrates allow the µLEDs to be removed from the growth substrate by laser lift off (LLO). The MQW structure is tuned to produce the desired emission color and the resulting structure is between 2 and 7 µm thick, see also FIG. 1A.

2) A current spreading layer is deposited on the p-GaN surface. The composition is typically a thin (10 nm or less) NiO$_x$ interface layer plus a transparent conductive oxide such as ITO, which may be 100 to 500 nm thick.

3) The emission area is defined by photolithography and the MOCVD stack is etched to a depth extending into the n-doped GaN layer, forming what is referred to herein as an "etched stack" structure.

4) The LED area is defined by photolithography and by etching the full stack down to the sapphire substrate.

5) An insulating layer typically, plasma-enhanced CVD (PECVD) silicon dioxide (SiO$_2$), 100 to 400 nm thick, is deposited to prevent current leakage across the device.

6) Contacts are opened in the insulating layer to the p-GaN and n-GaN regions.

7) A lithographic pattern is formed to prevent metal deposition outside the N-pad and P-pad contact areas, and the metal stack is deposited to connect to the LED contact openings.

a. The first metal layer is chosen for adhesion to oxide and a work function match with n-doped GaN. The typical material is Cr from 10 to 50 nm thick.
b. The next metals are chosen as a conductive barrier between the adhesion layer and solder material, which may be Cr/Au or Ti/Ni with a total thickness of 100-200 nm.
c. The top layer is a low melting temperature solder that can bond to the substrate electrode. One system is Sn alloy for melting temperature of the solder. Another metal system is Au/Ge.
d. Alternatively, the micro-LED may only receive metals from Steps 7a and 7b, while the low melting temperature solder can be formed on the display substrate electrodes.

8) The excess metal is removed by a lift off process.
9) The completed wafer top side is bonded to a temporary carrier with an adhesive layer and the sapphire growth wafer is removed by LLO.
10) Now the μLEDs are bottom up on the carrier wafer in a planar array that is suitable for further processing.
11) Optionally the n-GaN may be etched to reduce the thickness of the μLED.
12) Post (navigation keel) structures for fluidic assembly are optionally fabricated on the bottom surface near the center of the LED. The post may be cylindrical, conical, or reentrant shape with the post height and diameter chosen to facilitate bottom side up orientation of the μLED in the fluidic assembly process.
13) Finally, the completed μLEDs are harvested into a suspension by dissolving the adhesive using a suitable solvent.

Because red LEDs are fabricated in a different MOCVD process, the process flow is modified for GaAs based devices. The shapes of the devices and the position of electrodes and the post are similar to those for GaN devices, but the device thickness may be different. An exemplary process flow proceeds as follows:

1) An LED stack is deposited on a GaAs wafer by MOCVD as described above. The MQW structure is tuned to produce the desired emission color and the resulting structure is between 5 and 10 μm thick. See also FIG. 2A.
2) Optionally the p-GaP can be etched to reduce the thickness of the stack.
3) The completed wafer top side is bonded to a glass or sapphire temporary substrate with an adhesive layer and the GaAs growth wafer is removed by wet etching.
4) The LED area is defined by photolithography and the full stack is etched.
5) The emission area is defined by photolithography and the MOCVD stack is etched to a depth extending into the p-doped GaP layer, forming an etched stack.
6) A metal layer such as Cr/Au is deposited on p-GaP regions that match the work function of the layer.
7) A metal layer such as Ti/Au is deposited on n-GaP regions that match the work function of the layer.
8) An insulating layer, typically PECVD $SiO_2$ 100 to 400 nm thick, is deposited to prevent current leakage across the device.
9) Contacts are opened in the insulating layer to the p-GaP and n-GaP regions.
10) A lithographic pattern is formed to prevent metal deposition outside the N-pad and P-pad contact areas and the metal stack is deposited to connect to the μLED contact openings.
    a. The first metals are chosen as a conductive barrier between the adhesion layer and solder material, which may be Cr/Au or Ti/Ni with a total thickness of 100-200 nm.
    b. The top layer is a low melting temperature solder that can bond to the substrate electrode. One system is a Sn alloy for low melting temperature of the solder. Another suitable low melting temperature metal system is Au/Ge. Alternatively, this solder layer can be formed on the substrate electrode.
11) The excess metal is removed by a lift off process.
12) The completed wafer top side is bonded to a temporary wafer with an adhesive layer and the first temporary substrate is removed by dissolving the first adhesive.
13) Now the μLEDs are bottom up on the temporary wafer in a planar array that is suitable for further processing.
14) Optionally, the n-GaP may be etched to reduce the thickness of the micro-LED.
15) Post structures for fluidic assembly are optionally fabricated on the bottom near the center of the micro-LED. The post may be cylindrical, conical, or reentrant shape with the post height and diameter chosen to facilitate bottom side up orientation of the micro-LED in the fluidic assembly process.
16) The completed micro-LEDs are harvested into a suspension by dissolving the second adhesive using a suitable solvent.

Figure 12:
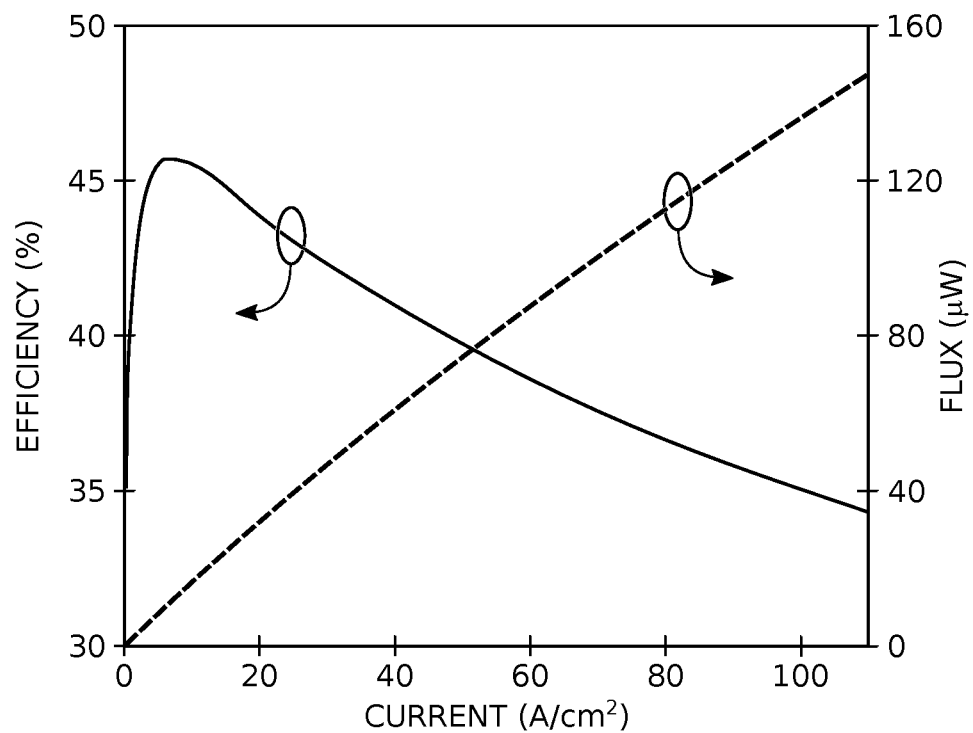
FIG. 12 is a graph depicting the relationship between flux and efficiency, as a function of current density.

FIG. 12 is a graph depicting the relationship between flux and efficiency, as a function of current density. One of the most important advantages of the micro-LED display is the very high brightness that inorganic LEDs can achieve, which allows for the flexibility to be able to match the emission performance of the display to a specific resolution and brightness requirement for a product. Small displays for wearables may only require 150-200 nits (candela per square meter) luminance, while televisions may be 500 to 1500 nits, and outdoor public information displays (PIDs) may be 2000 to over 4000 nits. Small displays for phones or tablets may be over 600 pixels per inch (ppi) resolution while large PID displays may be only 20 to 60 ppi so the area available for each micro-LED is quite different as well. Optical flux from a micro-LED is a nearly linear function of current density over a relatively broad range as shown in FIG. 12 for a GaN micro-LED emitting at 440 nm (blue). Thus, a micro-LED display regulates grey-scale intensity by controlling the current supplied to each sub-pixel. The wall plug efficiency of a micro-LED (optical output/electrical power) peaks at relatively low flux and then decreases gradually (droop) over a wide range of applied current. For display operation it is desirable to operate near the efficiency peak to minimize waste heat dissipated in the display. However, very low currents are difficult to regulate so the optimal current density for a given display depends on a variety of factors. General lighting LEDs operate at a high current density of around 70 amps per square centimeter ($A/cm^2$) to maximize light output per device, thereby minimizing cost per bulb. Micro-LED displays typically operate with a lower current density for higher reliability and lower heat dissipation, so the operating range may be between 1 and 30 $A/cm^2$. Other factors that influence the choice of micro-LED configuration include the efficiency of each color micro-LED, color gamut requirements, and the sensitivity of the human vision system which is centered in the green. Thus, it is advantageous to have a structure that allows adjustments of the emission area of the micro-LED, to balance the performance requirements, while keeping fixed the micro-LED characteristics such as post height, thickness, and diameter that are vital for high yield fluidic assembly.

Figure 13A:
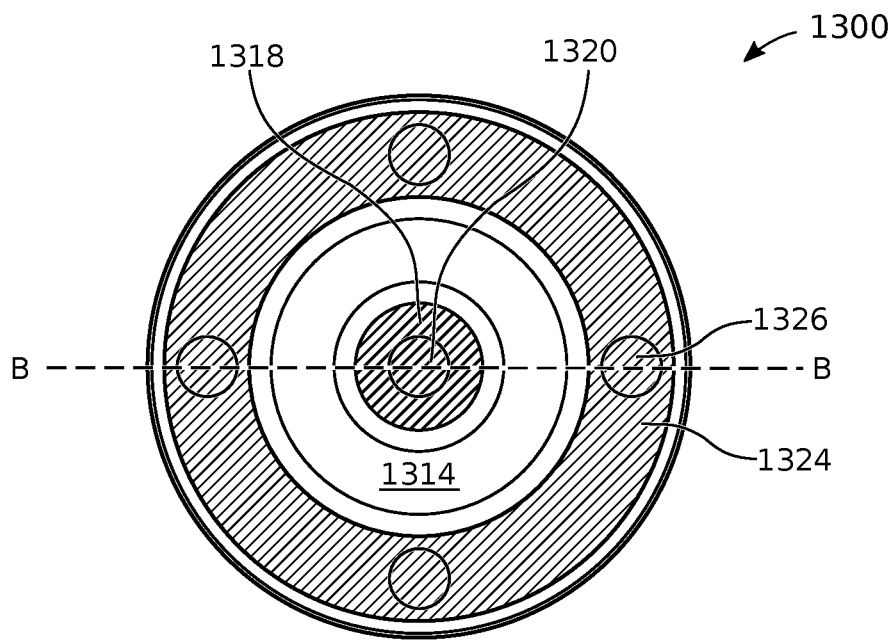
FIGS. 13A and 13B are, respectively, plan and partial cross-sectional views depicting a planar SM perimeter emission μLED.
Figure 13B:
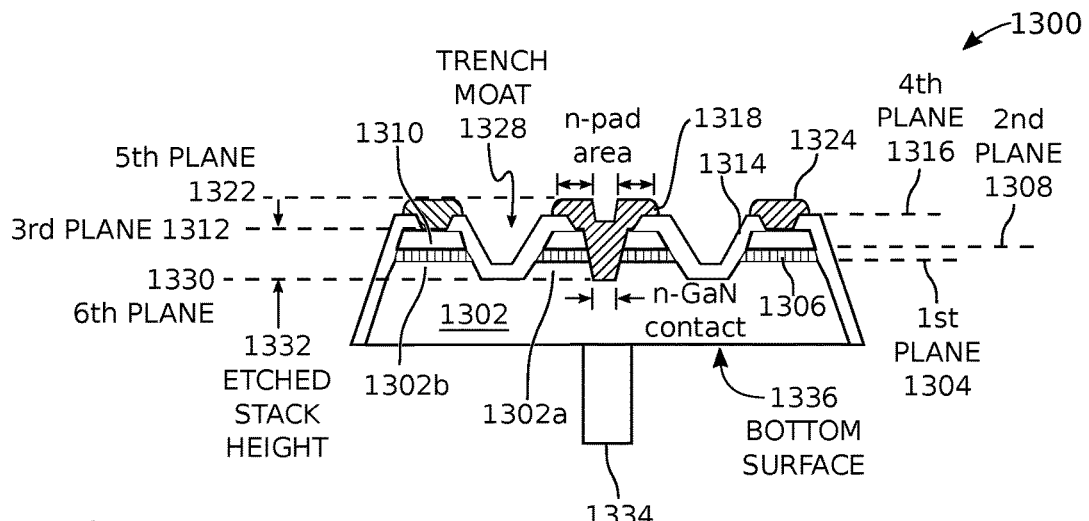

FIGS. 13A and 13B are, respectively, plan and partial cross-sectional views depicting a planar SM perimeter emission μLED. The perimeter emission μLED 1300 comprises a first doped semiconductor 1302 formed as a base and doped with either an n or p dopant. The first doped semiconductor has a top surface formed in a first plane 1304 comprising a center plateau 1302a separated from a perimeter 1302b. As shown in FIG. 13A, the first doped semiconductor base is circular, but other well-known geometric shapes are also possible. A MQW layer 1306 having a top surface is formed in a second plane 1308 overlying the first doped semiconductor center plateau 1302a and perimeter 1302b. A second doped semiconductor 1310, doped with a dopant opposite to the one used for the first doped semiconductor 1302, has a top surface in a third plane 1312 overlying the MQW layer 1306.

An electrical insulator 1314 is formed as a layer with a top surface in a fourth plane 1316 overlying the second doped semiconductor 1310. A first electrode 1318 overlies the center plateau 1302a and is connected to the first doped semiconductor 1302a through a center via 1320. The first electrode 1318 has a substrate interface surface in a fifth plane 1322. A second electrode 1324 overlies the perimeter of the electrical insulator 1314 and is connected to the second doped semiconductor 1310 through a perimeter via 1326. The second electrode 1324 has a substrate interface surface in the fifth plane 1322. A trench moat 1328 is formed in the first doped semiconductor 1302 separating the center plateau 1302a from the perimeter 1302b. The trench moat has a top surface formed in a sixth plane 1330 underlying the first plane 1302.

In one aspect, the first doped semiconductor 1302 and second doped semiconductor 1310 are doped GaN. Alternatively, the first doped semiconductor 1302 and second doped semiconductor 1310 are either p-doped p-GaP or n-doped n-GaInP. The first doped semiconductor center plateau 1302a, MQW layer 1306, and second doped semiconductor 1310 form an etched stack having a height 1332 orthogonal to the first plane 1304, second plane 1308, and third plane 1312 of less than 2 microns, with the planarity tolerance of the first, second, third and fourth planes being less than 10 nanometers. The average planarity tolerance of the electrode interface surfaces in the fifth plane is also less than 10 nm.

In one aspect, not shown, a solder layer forms part of the first and second electrode interface surfaces, and is made from an alloy such as In/Sn or Au/Ge. Alternatively, the substrate interface surfaces of the first and second electrodes are gold. Optionally as shown, a navigation keel or post 1334 is attached to the first doped semiconductor base bottom surface 1336.

The center emitter described above and shown in FIGS. 11A and 11C has an emission area that is 10 to 15% of the total surface area of the disk shaped micro-LED, where the micro-LED surface area is parallel to the first, second, and third planes. As shown in FIGS. 13A-13B, the structure can be changed so that the emission area is an outer ring structure covered by the P-pad and the center island (plateau) is a mechanical support for the N-pad electrode. In this aspect, the emission area can be about 50% of the micro-LED disk surface area. An advantage of this structure is that the continuous P-pad electrode is not interrupted by contact openings so a full 360-degree ring contact to the substrate interface electrical contact is possible. In this structure there is a trade-off between spreading resistance, which is driven down by increasing the center contact area, versus reducing the area of the plateau that holds the solder making contact to the substrate electrode.

Figure 14A:
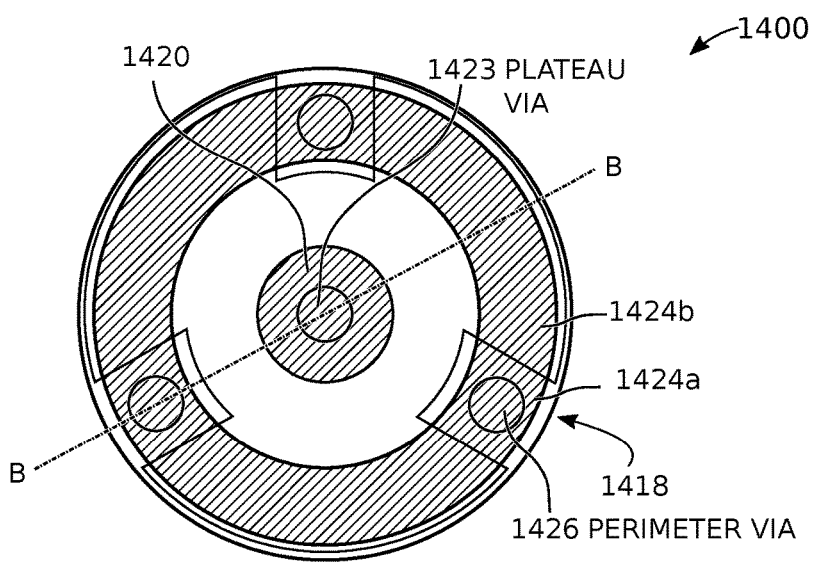
FIGS. 14A and 14B are, respectively, plan and partial cross-sectional views of a planar SM full area emission μLED.
Figure 14B:
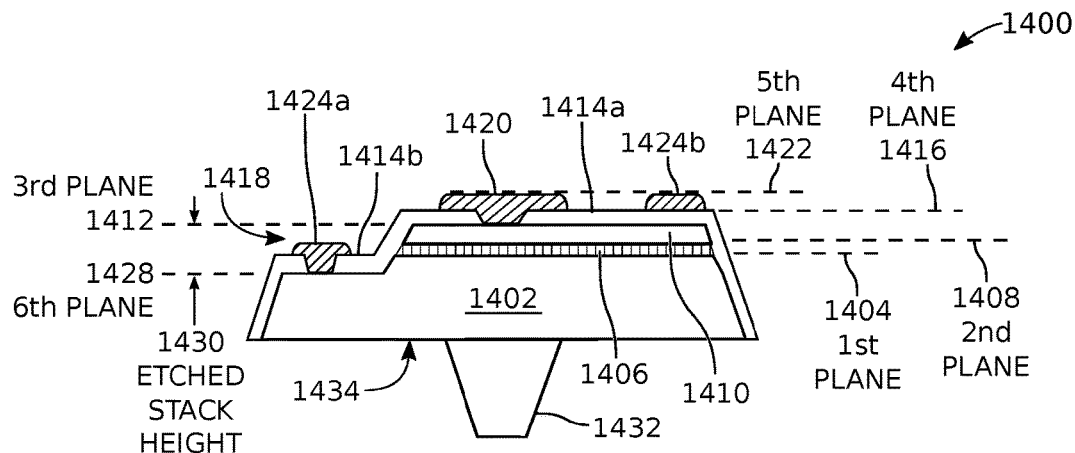

FIGS. 14A and 14B are, respectively, plan and partial cross-sectional views of a planar SM full area emission μLED. The full area emission μLED 1400 comprises a first doped semiconductor 1402 formed as a base and doped with either an n or p dopant. Although the first doped semiconductor base is depicted as circular is shape, it is not limited to any particular geometry. The first doped semiconductor 1402 has a top surface formed in a first plane 1404 comprising a plateau. A MQW layer 1406 has a top surface formed in a second plane 1408 overlying the first doped semiconductor plateau. A second doped semiconductor 1410, doped with a dopant opposite to that used in the first doped semiconductor, is formed as a layer having a top surface in a third plane 1412 overlying the MQW layer 1406. An electrical insulator with a first portion 1414a is formed as a layer with a top surface in a fourth plane 1416 overlying the second doped semiconductor 1410. An electrical insulator second portion 1414b overlies a first doped semiconductor perimeter trench valley 1418.

A first electrode 1420 overlies the plateau and is connected to the second doped semiconductor 1410 through a plateau via 1423. The first electrode 1420 has a substrate interface surface in a fifth plane 1422. A second electrode has a first portion 1424a overlying the perimeter trench valley 1418 and is connected to the first doped semiconductor 1402 through a perimeter via 1426. The second electrode second portion 1424b is formed overlying a perimeter of the electrical insulator first portion 1414a with a substrate interface surface in the fifth plane 1422. The first doped semiconductor perimeter trench valley 1418 has a top surface formed in a sixth plane 1428 underlying the first plane 1408.

In one aspect, the first doped semiconductor 1402 and second doped semiconductor 1410 are doped GaN. Alternatively, the first doped semiconductor 1402 and second doped semiconductor 1410 are either p-doped p-GaP or n-doped n-GaInP. As shown, the SM full area emission μLED may comprise a plurality of first doped semiconductor perimeter trench valleys 1 418. In that case, the second electrode first portion 1424a is formed on each perimeter trench valley 1418 and is connected to the first doped semiconductor 1402 through a corresponding perimeter via 1426. The second electrode second portion 1424b overlies perimeter segments of the electrical insulator first portion 1414a with a substrate interface surface in the fifth plane 1422.

The first doped semiconductor 1402, MQW layer 1406, and second doped semiconductor 1410 form an etched stack having a height 1430 orthogonal to the first plane 1404, second plane 1408, and third plane 1412 of less than 2 microns, with the planarity tolerance of the first, second, third, and fourth planes being less than 10 nanometers. The average planarity tolerance of the electrode interface surfaces in the fifth plane is also less than 10 nm.

In one aspect, not shown, a solder layer forms part of the first and second electrode interface surfaces, and is made from an alloy such as indium/tin (In/Sn) or gold/germanium (Au/Ge). Alternatively, the substrate interface surfaces of the first and second electrodes are gold. Optionally as shown, a navigation keel or post 1432 is attached to the first doped semiconductor base bottom surface 1434.

Figure 15A:
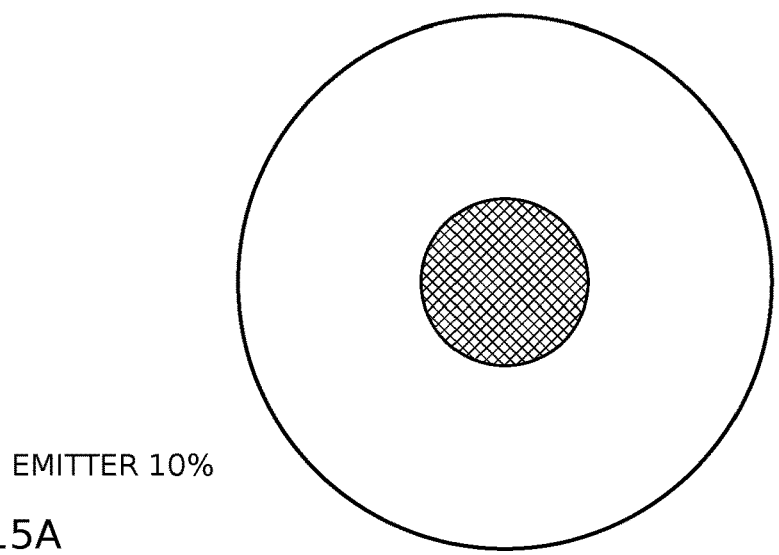
FIGS. 15A through 15C are plan views comparing the emission surface areas of the center emission (FIG. 11A), perimeter emission (FIG. 13A), and full area emission (FIG. 14A) micro-LEDs.
Figure 15B:
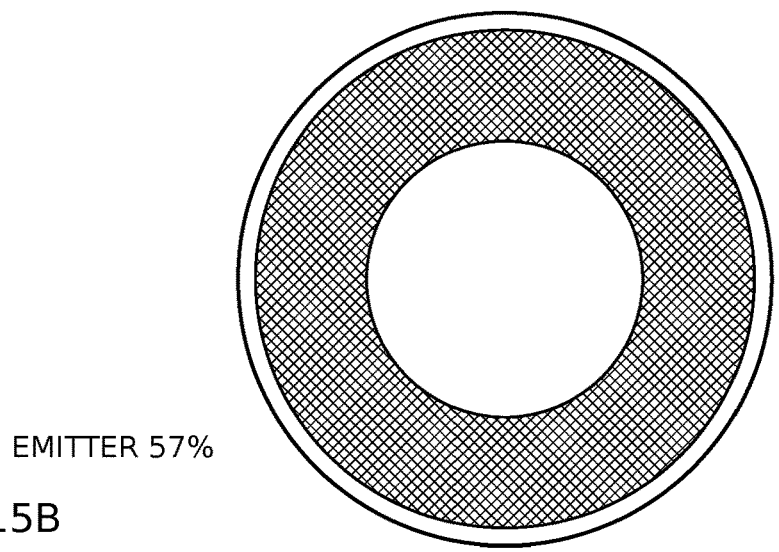
Figure 15C:
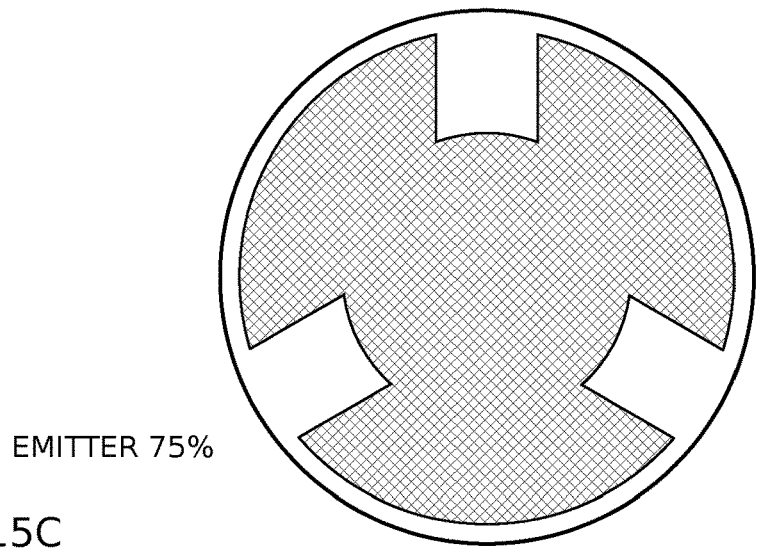

FIGS. 15A through 15C are plan views comparing the emission surface areas of the center emission (FIG. 11A), perimeter emission (FIG. 13A), and full area emission (FIG. 14A) micro-LEDs. If a large emission area is required, the full emitter design of FIG. 14A can be employed. The active emission area is also the mechanical support island for the P-pad electrode, so openings (3 are shown) in the active island (plateau) are made to contact the n-GaN region. In this case, the emission area is about 75% of the micro-LED disk diameter. For GaAs based devices the three-contact geometry is often more favorable as compared to the four-contact variant because there is only one thin region on any cleavage plane, making the micro-LEDs more mechanically robust. Another advantage of the full emitter structure is that etch damage on the perimeter of the device has less effect on the efficiency. This is especially important for the AlGaInP devices where surface recombination caused by etch damage causes lower emission around the perimeter of the LED, which limits the emission of small micro-LEDs.

The micro-LED designs described herein are compatible with conventional MOCVD manufacturing, and favorable for fluidic assembly and bonding with surface mount electrodes that are formed in the same plane. An additional benefit of the structures described is the flexibility to vary the emission area from 10 to 75% of the micro-LED area without changing the physical characteristics (diameter, thickness, sidewall angle, and post dimensions) that are critical for successful fluidic assembly.

Figure 16:
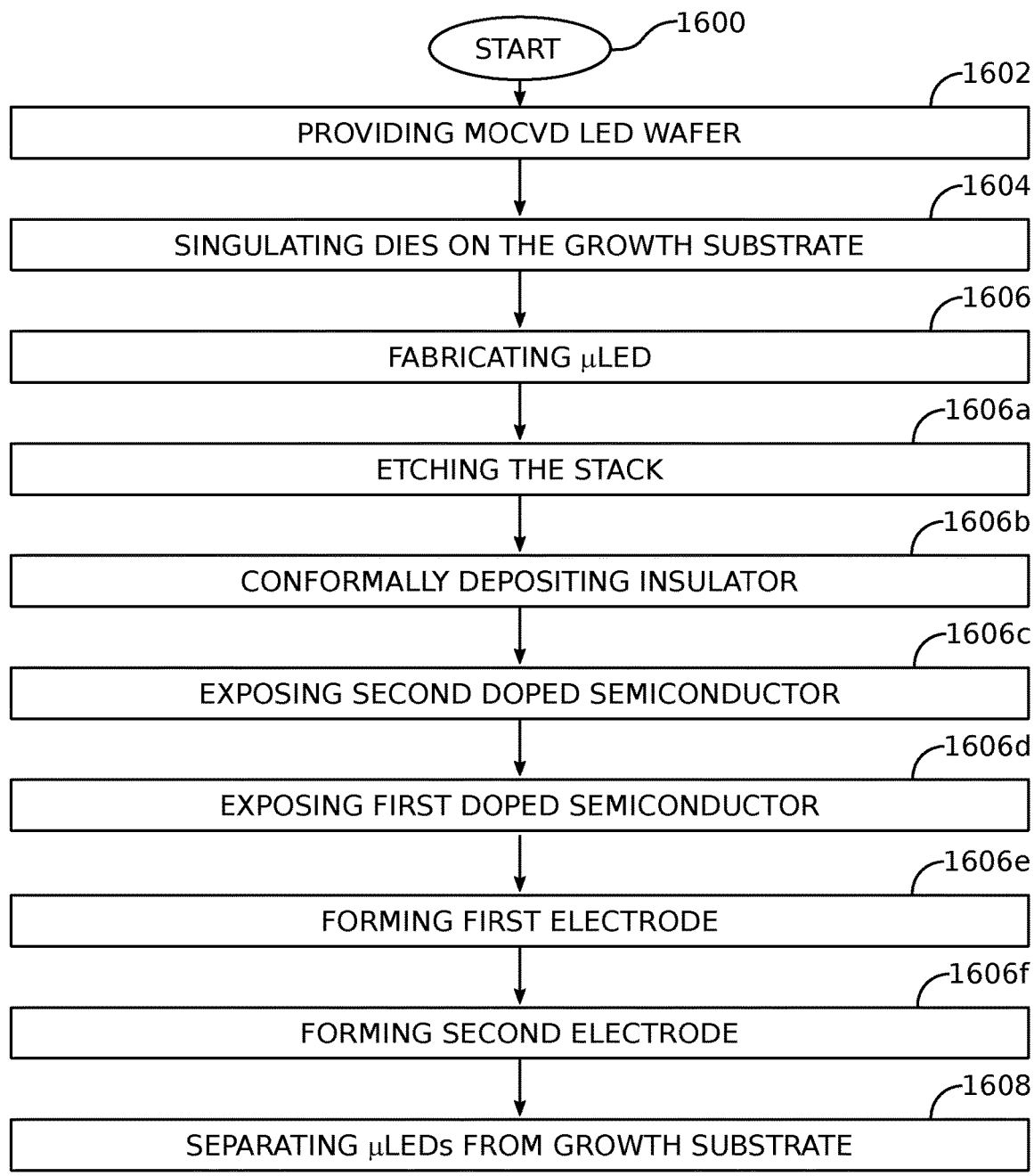
FIG. 16 is a flowchart illustrating a method for fabricating a SM μLED.

FIG. 16 is a flowchart illustrating a method for fabricating a SM μLED. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1600.

Figure 1A:
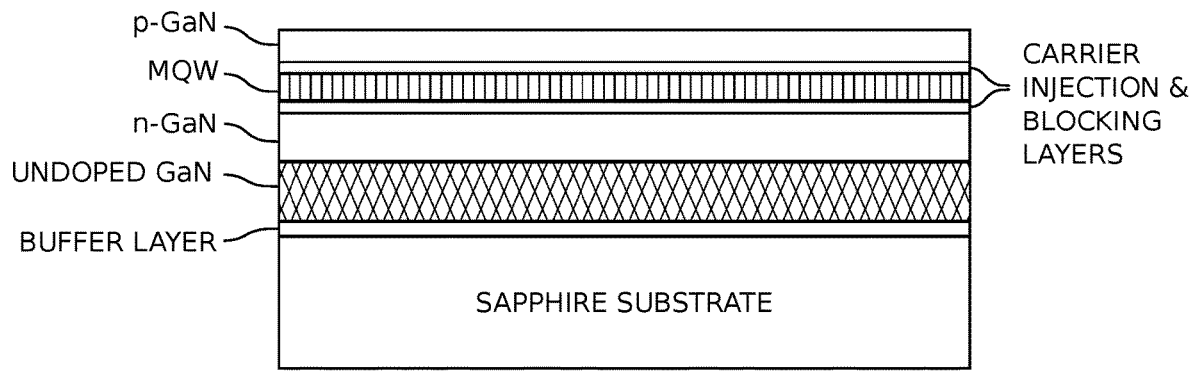
FIG. 1A through 1C are drawings depicting a GaN LED wafer used for general lighting purposes (prior art).
Figure 1B:
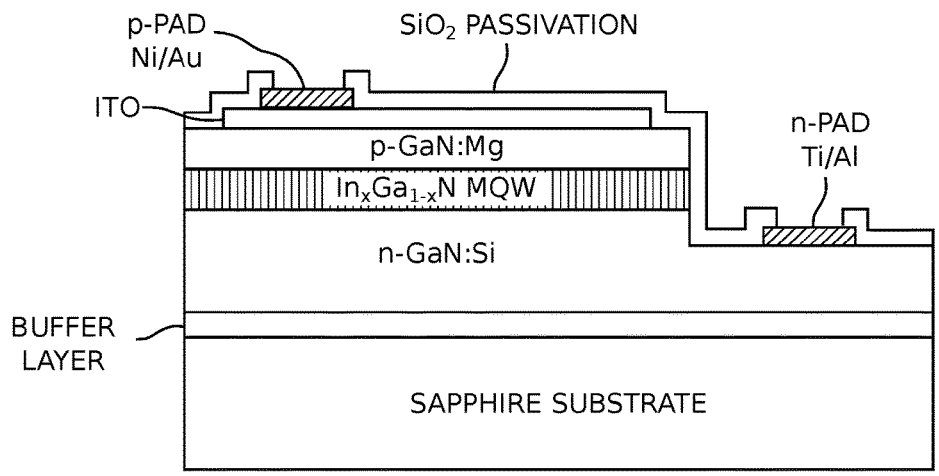
Figure 1C:
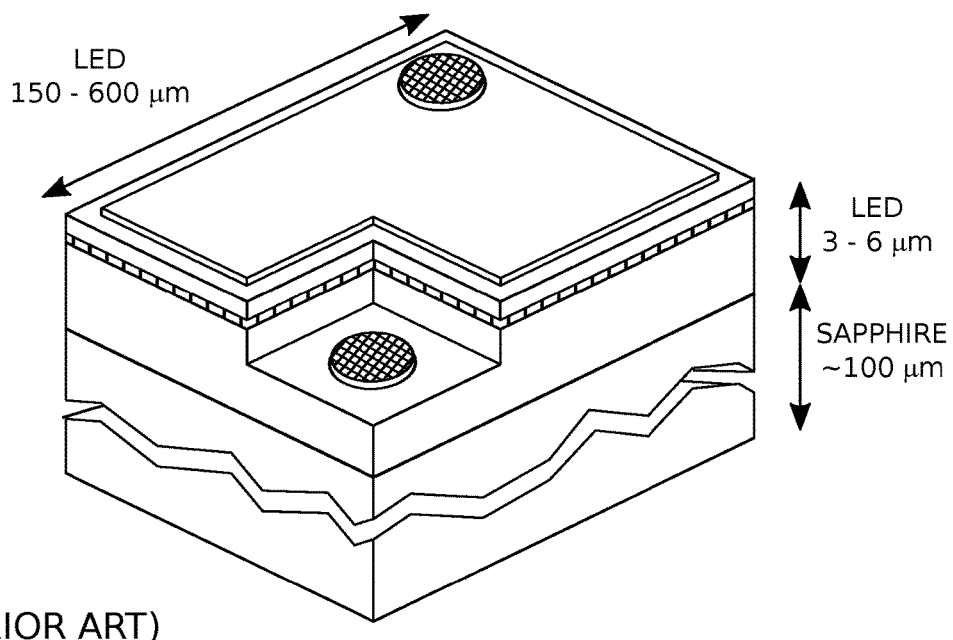
Figure 2A:
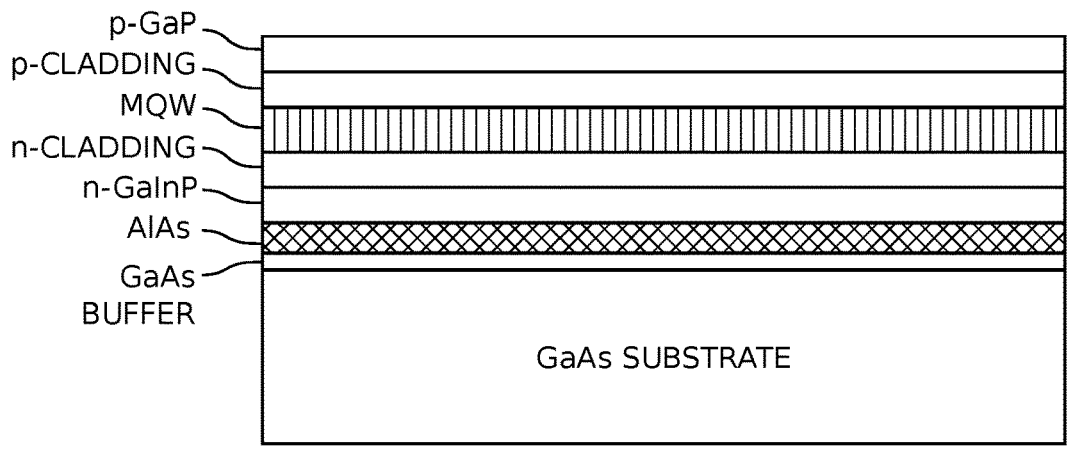
FIGS. 2A and 2B are diagrams depicting a gallium arsenide (GaAs) LED wafer used to make red emitting indicators (prior art).
Figure 2B:
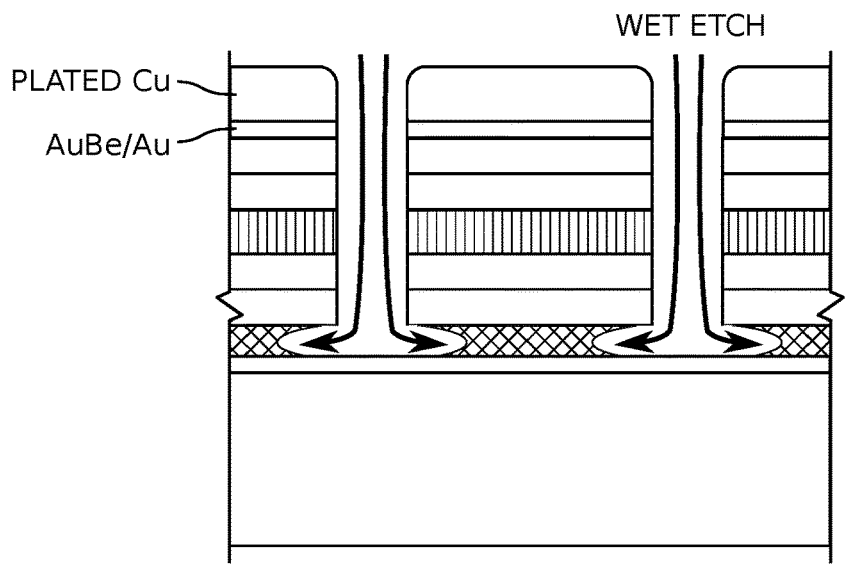
Figure 3A:
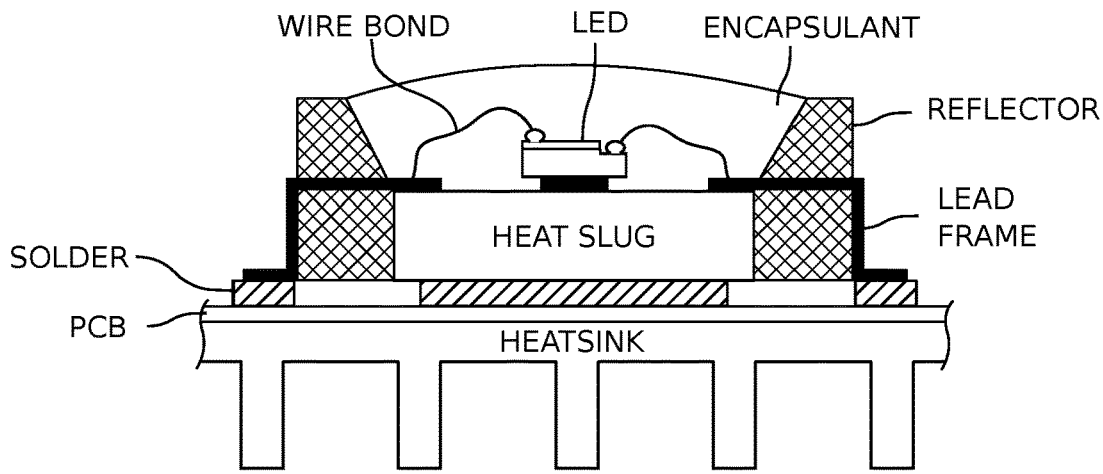
FIGS. 3A and 3B respectively depict partial cross-sectional views of conventional packaged blue and red LEDs (prior art).
Figure 3B:
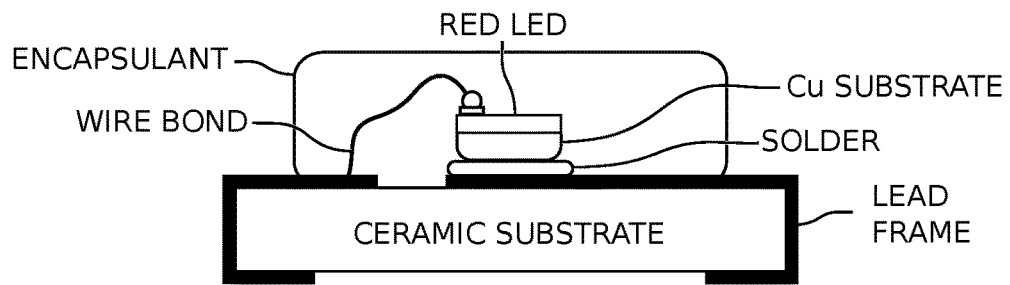

Step 1602 provides a MOCVD LED structure comprising a growth substrate, a stack overlying the growth substrate comprising a first doped semiconductor with a top surface in a first plane, a MQW layer overlying the first doped semiconductor having a top surface in a second plane, and a second doped semiconductor overlying the MQW layer and having a top surface in a third plane, see FIGS. 1A and 2A. The first and second doped semiconductors are oppositely doped with n and p dopants. The explicit semiconductor materials that can be used are mentioned above.

Step 1604 etches the MOCVD stack to form a plurality of singulated dies on the growth substrate. Step 1606 fabricates a μLED from each die as follows. Step 1606a selectively etches the stack. Step 1606b conformally deposits an electrical insulator to form a top surface in a fourth plane overlying the etched stack. Step 1606c selectively etches to expose the second doped semiconductor, creating a first via. Step 1606d selectively etches to expose the first doped semiconductor, creating a second via. Note: Step 1606d may be performed before Step 1606c in some circumstances, or performed concurrently in some circumstances after appropriate photolithography and patterning. Step 1606e forms a first electrode overlying the first via, connected to the second doped semiconductor through the first via, and has a substrate interface surface in a fifth plane. Step 1606f forms a second electrode overlying the second via, connected to the first doped semiconductor through the second via, and has a substrate interface surface in the fifth plane. In some aspects Steps 1606e and 1606f may be performed in the opposite order or performed concurrently with appropriate photolithography and patterning. Step 1608 separates the fabricated μLEDs from the growth substrate.

In one aspect, the method fabricates a center emission μLED, in which case selectively etching the stack (Step 1606a) includes creating a central plateau stack surrounded by a trench moat exposing the first doped semiconductor, and a perimeter stack segmented by a perimeter trench valley exposing the first doped semiconductor. Conformally depositing the electrical insulator overlying the etched stack in Step 1606b includes forming the fourth plane overlying the central plateau stack and the perimeter stack. Selectively etching to expose the second doped semiconductor in Step 1606c includes etching a portion of the electrical insulator overlying the central plateau stack to create the first via, and selectively etching to expose the first doped semiconductor in Step 1606d includes etching the electrical insulator overlying the perimeter trench valley to create the second via. Then, forming the first electrode in Step 1606e includes forming the first electrode overlying the central plateau stack, connected to the second doped semiconductor through the first via. Forming the second electrode in Step 1606f includes forming a second electrode having a first portion formed on the perimeter trench valley, connected to the first doped semiconductor through the second via, and forming a second portion overlying the electrical insulator formed on the perimeter stack, having a substrate interface surface in the fifth plane.

In another aspect, the method fabricates a perimeter emission μLED by selectively etching the MOCVD stack (Step 1606a) to create a central plateau stack separated from a perimeter stack by a trench moat exposing the first doped semiconductor. Conformally depositing the electrical insulator in Step 1606b includes forming the fourth plane overlying the central plateau stack and the perimeter stack. Selectively etching to expose the second doped semiconductor in Step 1606c includes etching a portion of the electrical insulator overlying the perimeter stack to expose the second doped semiconductor. Selectively etching to expose the first doped semiconductor in Step 1606d includes etching a portion of the electrical insulator, as well as underlying portions of second doped semiconductor and MQW layer in the central plateau stack, to expose the first doped semiconductor. Forming the first electrode in Step 1606e includes forming the first electrode overlying the electrical insulator formed on the perimeter stack, connected to the second doped semiconductor through the first via. Forming the second electrode in Step 1606f includes forming the second electrode overlying the central plateau stack, connected to the first doped semiconductor through the second via.

In another variation the method fabricates a full area emission μLED by selectively etching the MOCVD stack (Step 1606a) to form a plateau stack and a perimeter trench valley in the plateau stack exposing the first doped semiconductor. Selectively etching to expose the second doped semiconductor in Step 1606c includes etching a portion of the electrical insulator overlying the plateau stack to expose the second doped semiconductor. Selectively etching to expose the first doped semiconductor in Step 1606d includes etching electrical insulator overlying the perimeter trench valley. Forming the first electrode in Step 1606e includes forming the first electrode overlying the plateau stack, connected to the second doped semiconductor through the first via. Forming the second electrode in Step 1606f includes forming a first portion of the second electrode overlying the perimeter trench via connected to the first doped semiconductor through the second via, and forming a second portion overlying the electrical insulator formed on a perimeter of the plateau stack, having a substrate interface surface in the fifth plane.

As explained above, the fabricated µLEDs of Step 1608 have a maximum cross-section co-planar with the first, second, and third planes of 150 microns, a plateau stack (etched stack) height orthogonal to the first, second, and third planes of less than 2 microns, and an average fifth plane planarity tolerance of less than 10 nanometers.

Figure 17:
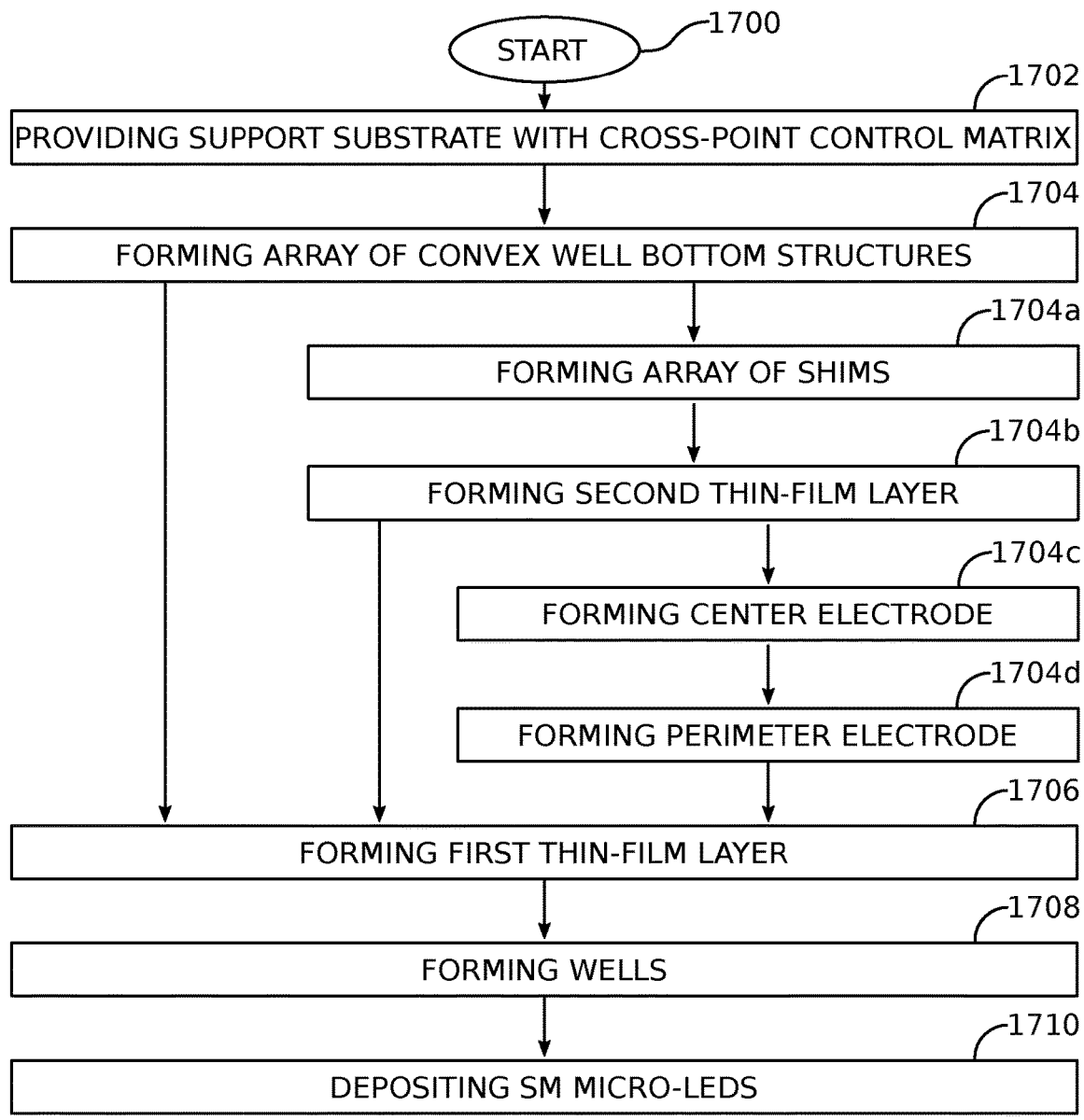
FIG. 17 is a flowchart illustrating a method for fabricating a display substrate with a well bottom surface shim.

FIG. 17 is a flowchart illustrating a method for fabricating an emissive display substrate. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method is as described above, and typically follows the numeric order of the steps presented below.

The method begins at Step 1700. Step 1702 provides a support substrate with a planar top surface and an LED cross-point control matrix comprising an array of column and row conductive lines. Step 1704 forms an array of convex well bottom structures overlying the support substrate top surface. Step 1706 forms a first thin-film layer overlying the support substrate top surface and convex well bottom structures. Step 1708 forms wells in the first thin-film layer, exposing the convex well bottom structures. Step 1710 fluidically deposits surface mount micro-LEDs in the wells.

In one aspect, forming the array of convex well bottom structures in Step 1704 includes, for each convex well bottom structure, forming a first substrate electrode electrically connected to a corresponding column line, and a second substrate electrode electrically connected to a corresponding row line. In another aspect, prior to forming the first thin-film layer, Step 1704a forms an array of shims overlying the support substrate top surface. The shims may be an electrically conductive or insulative material. Step 1704b forms a second thin-film layer overlying the array of shims.

In one aspect, forming the array of shims in Step 1704a includes forming shims having a width and a top surface. Then, forming the wells in the first thin-film layer in Step 1708 includes forming wells having a diameter (cross-section) greater than the shim width. The shape of the well convex bottom surface is responsive to the difference in height between the shim top surface and the support substrate top surface.

In another aspect, forming the array of convex well bottom structures in Step 1704 includes additional substeps. Step 1704c forms a center first substrate electrode having a first electrical interface surface for electrical connection to a micro-LED. Step 1704d forms a perimeter second substrate electrode having a second electrical interface surface, lower than the first electrical interface surface, as defined with respect to the support substrate top surface, for electrical connection to a micro-LED.

In yet another aspect, forming the array of shims in Step 1704a includes forming each shim directly overlying (in electrical contact with) a column line, forming a column interconnect shim. Then, forming the second thin-film layer in Step 1704b includes forming a via in the second thin-film layer overlying each column interconnect shim, and forming the center first substrate electrode in Step 1704c includes forming the center first substrate electrode overlying the via and electrically connected to the column interconnect shim.

Depositing the surface mount micro-LEDs in Step 1710 typically includes populating the wells with micro-LEDs having a top surface with a center first electrode and a perimeter second electrode, having substrate interface surfaces connected, respectively, to the first substrate electrode and second substrate electrode. In one aspect, the micro-LEDs have a center first electrode and perimeter second electrode with co-planar substrate interface surfaces, such as center emission, perimeter emission, and full area emission micro-LEDs described in detail above. Alternatively, micro-LEDs may have non co-planar center first electrode and perimeter second electrode substrate interface surfaces, as depicted in FIGS. 9D and 9E.

Planar surface mount micro-LEDs and associated fabrication processes have been presented. Examples of particular semiconductor materials, geometries, and explicit process steps have been presented to illustrate the invention. However, the invention is not limited to merely these examples. Other variations and embodiments of the invention will occur to those skilled in the art.

We claim:

1. A planar surface mount (SM) center emission micro-light emitting diode (µLED) comprising:
   a first doped semiconductor formed as a base and doped with a dopant selected from the dopant group consisting of n and p dopants, the first doped semiconductor comprising a planar bottom surface and a center plateau formed in a top surface first plane separated from a perimeter formed in the top surface first plane;
   a multiple quantum well (MQW) layer having a top surface formed in a second plane overlying the first doped semiconductor center plateau and perimeter;
   a second doped semiconductor doped with the unselected dopant from the dopant group, formed as a layer having a top surface in a third plane overlying the MQW layer;
   an electrical insulator having a first portion formed as a layer with a top surface in a fourth plane overlying the second doped semiconductor, and a second portion overlying a perimeter trench valley segmenting the perimeter with a top surface in a plane located between the first plane and the fourth plane;
   a first electrode overlying the center plateau, connected to the second doped semiconductor by a center via through the electrical insulator first portion, and having a substrate interface surface in a fifth plane; and,
   a second electrode having a first portion with a substrate interface surface formed on the electrical insulator second portion and connected to the first doped semiconductor by a perimeter via formed through the electrical insulator, and a second portion overlying a perimeter of the electrical insulator first portion and having a substrate interface surface in the fifth plane.

2. The SM center emission µLED of claim 1 further comprising:
   a trench moat formed in the first doped semiconductor separating the center plateau from the perimeter;
   wherein the trench moat and perimeter trench valley have top surfaces formed in a sixth plane underlying the first plane.

3. The SM center emission µLED of claim 1 wherein the first and second doped semiconductors are doped gallium nitride (GaN).

4. The SM center emission µLED of claim 1 wherein the first and second doped semiconductors are selected from the group consisting of p-doped gallium phosphide (p-GaP) or n-doped gallium indium phosphide (n-GaInP).

5. The SM center emission μLED of claim 1 further comprising:
- a plurality of first doped semiconductor perimeter segments separated by a plurality of perimeter trench valleys;
- wherein the MQW layer, second doped semiconductor, and electrical insulator first portion overlie each first doped semiconductor perimeter segment; and,
- wherein the second electrode first portion is formed on each perimeter trench valley and connected to the first doped semiconductor through a corresponding perimeter via, and wherein the second electrode second portion overlies segmented perimeters of the electrical insulator first portion with a substrate interface surface in the fifth plane.

6. The SM center emission μLED of claim 1 wherein the first doped semiconductor, MQW layer, and second doped semiconductor form an etched stack having a height orthogonal to the first, second, and third planes of less than 2 microns; and,
- wherein the average planarity tolerance of the first and second electrode interfaces in the fifth plane is less than 10 nanometers.

7. The SM center emission μLED of claim 1 wherein the first doped semiconductor base has a circular perimeter.

8. The SM center emission μLED of claim 1 wherein the first and second electrode interface surfaces include a solder layer made from an alloy selected from the group consisting of indium/tin (In/Sn) and gold/germanium (Au/Ge).

9. The SM center emission μLED of claim 1 wherein the substrate interface surfaces of the first and second electrodes are gold.

10. The SM center emission μLED of claim 1
further comprising:
- a navigation keel attached to the first doped semiconductor base bottom surface.

11. A planar surface mount (SM) perimeter emission micro-light emitting diode (μLED) comprising:
- a first doped semiconductor formed as a base and doped with a dopant selected from the dopant group consisting of n and p dopants, the first doped semiconductor comprising a planar bottom surface, and a center plateau formed in a top surface first plane separated from a perimeter formed in the top surface first plane;
- a multiple quantum well (MQW) layer having a top surface formed in a second plane overlying the first doped semiconductor center plateau and perimeter;
- a second doped semiconductor doped with the unselected dopant from the dopant group and formed as a layer having a top surface in a third plane overlying the MQW layer;
- an electrical insulator formed as a layer with a top surface in a fourth plane overlying the second doped semiconductor;
- a first electrode overlying the electrical insulator, connected to the first doped semiconductor center plateau by a center via formed through the second doped semiconductor, MQW layer, and electrical insulator, and having a substrate interface surface in a fifth plane; and,
- a second electrode overlying a perimeter of the electrical insulator and connected to the second doped semiconductor by a perimeter via formed through the electrical insulator, and having a substrate interface surface in the fifth plane.

12. The SM perimeter emission μLED of claim 11 further comprising:
- a trench moat formed in the first doped semiconductor separating the center plateau from the perimeter, having a top surface formed in a sixth plane underlying the first plane.

13. The SM perimeter emission μLED of claim 11 wherein the first and second doped semiconductors are doped gallium nitride (GaN).

14. The SM perimeter emission μLED of claim 11 wherein the first and second doped semiconductors are selected from the group consisting of p-doped gallium phosphide (p-GaP) or n-doped gallium indium phosphide (n-GaInP).

15. The SM perimeter emission μLED of claim 11 wherein the first doped semiconductor, MQW layer, and second doped semiconductor form an etched stack having a height orthogonal to the first, second, and third planes of less than 2 microns; and,
- wherein the average planarity tolerance of the first and second electrode interface surfaces in the fifth plane is less than 10 nanometers.

16. The SM perimeter emission μLED of claim 11 wherein the first doped semiconductor base has a circular perimeter.

17. The SM perimeter emission μLED of claim 11 wherein the first and second electrode interface surfaces include a solder layer made from an alloy selected from the group consisting of indium/tin (In/Sn) and gold/germanium (Au/Ge).

18. The SM perimeter emission μLED of claim 11 wherein the substrate interface surfaces of the first and second electrodes are gold.

19. The SM perimeter emission μLED of claim 11
further comprising:
- a navigation keel attached to the first doped semiconductor base bottom surface.

20. A planar surface mount (SM) full area emission micro-light emitting diode (μLED) comprising:
- a first doped semiconductor formed as a base and doped with a dopant selected from the dopant group consisting of n and p dopants, the first doped semiconductor having a top surface formed in a first plane comprising a plateau;
- a multiple quantum well (MQW) layer having a top surface formed in a second plane overlying the first doped semiconductor plateau;
- a second doped semiconductor doped with the unselected dopant from the dopant group and formed as a layer having a top surface in a third plane overlying the MQW layer;
- an electrical insulator with a first portion formed as a layer with a top surface in a fourth plane overlying the second doped semiconductor, and a second portion overlying a first doped semiconductor perimeter trench valley with a top surface located in a plane between the first plane and the fourth plane;
- a first electrode overlying the plateau, connected to the second doped semiconductor by a plateau via formed through the electrical insulator first portion, and having a substrate interface surface in a fifth plane; and,
- a second electrode having a first portion with a substrate interface surface formed on the electrical insulator second portion and connected to the first doped semiconductor by a perimeter via formed through the electrical insulator, and a second portion formed overlying a perimeter of the electrical insulator first portion with a substrate interface surface in the fifth plane.

21. The SM full area emission µLED of claim 20 wherein the first doped semiconductor perimeter trench valley has a top surface formed in a sixth plane underlying the first plane.

22. The SM full area emission µLED of claim 20 wherein the first and second doped semiconductors are doped gallium nitride (GaN).

23. The SM full area emission µLED of claim 20 wherein the first and second doped semiconductors are selected from the group consisting of p-doped gallium phosphide (p-GaP) or n-doped gallium indium phosphide (n-GaInP).

24. The SM full area emission µLED of claim 20 further comprising:
a plurality of first doped semiconductor perimeter trench valleys; and,
wherein the second electrode first portion is formed on each perimeter trench valley and connected to the first doped semiconductor through a corresponding perimeter via, and wherein the second electrode second portion overlies perimeter segments of the electrical insulator first portion with a substrate interface surface in the fifth plane.

25. The SM full area emission µLED of claim 20 wherein the first doped semiconductor, MQW layer, and second doped semiconductor form an etched stack having a height orthogonal to the first, second, and third planes of less than 2 microns; and,
wherein the average planarity tolerance of the first and second electrode interface surfaces in the fifth plane is less than 10 nanometers.

26. The SM full area emission µLED of claim 20 wherein the first doped semiconductor base has a circular perimeter.

27. The SM full area emission µLED of claim 20 wherein the first and second electrode interface surfaces include a solder layer made from an alloy selected from the group consisting of indium/tin (In/Sn) and gold/germanium (Au/Ge).

28. The SM full area emission µLED of claim 20 wherein the substrate interface surfaces of the first and second electrodes are gold.

29. The SM full area emission µLED of claim 20 wherein the first doped semiconductor base has a bottom surface; and,
the SM full area emission µLED further comprising:
a navigation keel attached to the first doped semiconductor base bottom surface.

30. A method for fabricating a surface mount (SM) micro light emitting diode (µLED), the method comprising:
providing a metalorganic chemical vapor deposition (MOCVD) LED structure comprising a growth substrate, a stack overlying the growth substrate comprising a first doped semiconductor with a top surface in a first plane, a multiple quantum well (MQW) layer overlying the first doped semiconductor having a top surface in a second plane, and a second doped semiconductor overlying the MQW layer and having a top surface in a third plane, where the first and second doped semiconductors are oppositely doped with n and p dopants;
etching the MOCVD structure to form a plurality of singulated dies on the growth substrate;
fabricating a µLED from each die as follows:
selectively etching the MOCVD stack;
conformally depositing an electrical insulator to form a top surface in a fourth plane overlying the etched stack;
selectively etching to expose the second doped semiconductor, creating a first via;
selectively etching to expose the first doped semiconductor, creating a second via;
forming a first electrode overlying the first via, connected to the second doped semiconductor through the first via, and having a substrate interface surface in a fifth plane;
forming a second electrode overlying the second via, connected to the first doped semiconductor through the second via, and having a substrate interface surface in the fifth plane; and,
separating the fabricated µLEDs from the growth substrate.

31. The method of claim 30 wherein the SM µLED is a center emission µLED;
wherein selectively etching the MOCVD stack includes creating a central plateau stack surrounded by a trench moat exposing the first doped semiconductor, and a perimeter stack segmented by a perimeter trench valley exposing the first doped semiconductor;
wherein conformally depositing the electrical insulator overlying the etched stack includes forming the fourth plane overlying the central plateau stack and the perimeter stack;
wherein selectively etching to expose the second doped semiconductor includes etching a portion of the electrical insulator overlying the central plateau stack to create the first via;
wherein selectively etching to expose the first doped semiconductor includes etching the electrical insulator overlying the perimeter trench valley to create the second via;
wherein forming the first electrode includes forming the first electrode overlying the central plateau stack and connected to the second doped semiconductor through the first via; and,
wherein forming the second electrode includes forming a second electrode having a first portion formed on the perimeter trench valley and connected to the first doped semiconductor through the second via, and a second portion overlying the electrical insulator formed on the perimeter stack and having a substrate interface surface in the fifth plane.

32. The method of claim 30 wherein the SM µLED is a perimeter emission µLED;
wherein selectively etching the stack includes creating a central plateau stack separated from a perimeter stack by a trench moat exposing the first doped semiconductor;
wherein conformally depositing the electrical insulator includes forming the fourth plane overlying the central plateau stack and the perimeter stack;
wherein selectively etching to expose the second doped semiconductor includes etching a portion of the electrical insulator overlying the perimeter stack to expose the second doped semiconductor;
wherein selectively etching to expose the first doped semiconductor includes etching a portion of the electrical insulator, as well as underlying portions of second doped semiconductor and MQW layer in the central plateau stack, to expose the first doped semiconductor;
wherein forming the first electrode includes forming the first electrode overlying the electrical insulator formed on the perimeter stack, and connected to the second doped semiconductor through the first via; and, wherein forming the second electrode includes forming the second electrode overlying the central plateau stack and connected to the first doped semiconductor through the second via.

33. The method of claim 30 wherein the SM μLED is a full area emission μLED;

wherein selectively etching the MOCVD stack includes forming a plateau stack and a perimeter trench valley in the plateau stack exposing the first doped semiconductor;

wherein selectively etching to expose the second doped semiconductor includes etching a portion of the electrical insulator overlying the plateau stack to expose the second doped semiconductor;

wherein selectively etching to expose the first doped semiconductor includes etching electrical insulator overlying the perimeter trench valley;

wherein forming the first electrode includes forming the first electrode overlying the plateau stack and connected to the second doped semiconductor through the first via; and, wherein forming the second electrode includes forming a first portion of the second electrode overlying the perimeter trench via and connected to the first doped semiconductor through the second via, and a second portion overlying the electrical insulator formed on a perimeter of the plateau stack and having a substrate interface surface in the fifth plane.

34. The method of claim 30 wherein separating fabricated μLEDs from the growth substrate includes forming μLEDs having a maximum cross-section co-planar with the first, second, and third planes of 150 microns, a plateau stack height orthogonal to the first, second, and third planes of less than 2 microns, and an average fifth plane planarity tolerance of less than 10 nanometers.

* * * * *